US008765012B2

(12) United States Patent
Jung et al.

(10) Patent No.: US 8,765,012 B2
(45) Date of Patent: *Jul. 1, 2014

(54) THERMOSETTING COMPOSITION AND PRINTED CIRCUIT BOARD USING THE SAME

(75) Inventors: Myung Sup Jung, Seongnam-si (KR); Chung Kun Cho, Suwon-si (KR); Kwang Hee Kim, Seoul (KR); Kalinina Fedosya, Yongin-si (KR); Man Jong Kim, Daejeon (KR); Tae Jun Ok, Daejeon (KR)

(73) Assignees: Samsung Electronics Co., Ltd. (KR); Samsung Electro-Mechanics Co., Ltd. (KR); Samsung Fine Chemicals Co., Ltd. (KR)

( * ) Notice: Subject to any disclaimer, the term of this patent is extended or adjusted under 35 U.S.C. 154(b) by 1150 days.

This patent is subject to a terminal disclaimer.

(21) Appl. No.: 12/621,043

(22) Filed: Nov. 18, 2009

(65) Prior Publication Data
US 2010/0124037 A1    May 20, 2010

(30) Foreign Application Priority Data

Nov. 18, 2008   (KR) .................. 10-2008-0114806
May 15, 2009    (KR) .................. 10-2009-0042671
Nov. 4, 2009    (KR) .................. 10-2009-0105844

(51) Int. Cl.
*C09K 19/52*    (2006.01)

(52) U.S. Cl.
USPC . 252/299.61; 525/417; 525/437; 252/299.63; 252/299.62; 528/176; 528/206; 528/80; 524/612

(58) Field of Classification Search
USPC .......... 525/417, 418, 437; 252/299.01, 299.6, 252/299.61, 299.63; 528/176, 179, 194, 528/206, 207, 59, 67, 69, 80; 524/612
See application file for complete search history.

(56) References Cited

U.S. PATENT DOCUMENTS

| | | | |
|---|---|---|---|
| 5,102,935 A * | 4/1992 | Heinz et al. | 524/219 |
| 5,114,612 A | 5/1992 | Benicewicz et al. | |
| 5,315,011 A | 5/1994 | Benicewicz et al. | |
| 5,322,917 A | 6/1994 | Auman et al. | |
| 5,575,949 A | 11/1996 | Benicewicz et al. | |
| 5,811,507 A | 9/1998 | Chan et al. | |
| 7,507,784 B2 * | 3/2009 | Dingemans et al. | 528/170 |
| 7,655,155 B2 * | 2/2010 | Jung et al. | 252/299.01 |
| 8,105,663 B2 * | 1/2012 | Lee et al. | 428/1.6 |
| 2009/0111949 A1 * | 4/2009 | Cho et al. | 525/417 |
| 2009/0117348 A1 * | 5/2009 | Cho et al. | 428/195.1 |
| 2009/0224203 A1 * | 9/2009 | Jung et al. | 252/299.61 |
| 2009/0308643 A1 * | 12/2009 | Cho et al. | 174/256 |
| 2010/0139961 A1 * | 6/2010 | Kim et al. | 174/258 |
| 2010/0159231 A1 * | 6/2010 | Cho et al. | 428/304.4 |
| 2010/0203326 A1 * | 8/2010 | Ok | 428/337 |

FOREIGN PATENT DOCUMENTS

JP    11-092647    4/1999

* cited by examiner

*Primary Examiner* — Peter F Godenschwager
*Assistant Examiner* — Jane L Stanley
(74) *Attorney, Agent, or Firm* — Cantor Colburn LLP

(57) ABSTRACT

A thermosetting composition including an organic solvent, a liquid crystalline thermoset oligomer, and either a crosslinking agent or an epoxy resin or both is disclosed. A printed circuit board which includes the thermosetting composition is also disclosed. The printed circuit board is produced by impregnating the thermosetting composition into a reinforcing material.

34 Claims, 7 Drawing Sheets

THERMOSETTING COMPOSITION AND PRINTED CIRCUIT BOARD USING THE SAME

CROSS-REFERENCE TO RELATED APPLICATION

This application claims priority to Korean Patent Application No. 10-2008-114806, filed on Nov. 18, 2008, Korean Patent Application No. 10-2009-42671, filed on May 15, 2009, and Korean Patent Application No. 10-2009-105844, filed on Nov. 4, 2009, and all the benefits accruing therefrom under 35 U.S.C. §119, the contents of which in their entirety are herein incorporated by reference.

BACKGROUND

1. Field

The present disclosure relates to a thermosetting composition and a printed circuit board using the same. More specifically, the thermosetting composition includes a liquid crystalline thermoset ("LCT") oligomer and either a crosslinking agent or an epoxy resin or both.

2. Description of the Related Art

Recent advances in information and communication technologies have transformed our society into a high-tech communication and information society based on the convergence of computers and communication devices. The trend toward miniaturization and high performance of electronic devices, including mobile phones and personal computers, has led to high-density integration of printed circuit boards as essential elements of the electronic devices. Such high-density integration is achieved by various methods, for example, by stacking printed circuit boards, reducing the thickness of printed circuit boards, and reducing the diameter and interval of through-holes of printed circuit boards. With the recent trend toward the development of advanced printed circuit boards, low thermal expansion, low dielectric constant/dielectric loss, and low moisture absorption properties for polymer composite materials such as copper clad laminates ("CCLs"), resin coated copper ("RCC") and prepregs, have increasingly gained importance as essential materials for the production of printed circuit boards. However, bismaleimide-triazine ("BT") resins and epoxy-based flame retardant 4 ("FR-4") copper clad laminates that are mainly in use as board materials fail to provide other satisfactory properties, for example, low dielectric properties, low thermal expansion and low moisture absorption properties, which are required in printed circuit boards. Thus, there is a need for novel materials with higher performance that can replace existing materials for printed circuit boards.

SUMMARY

In an embodiment, a thermosetting composition includes: a liquid crystalline thermoset oligomer containing at least aromatic or alicyclic structural unit with a kink structure in the backbone and having one or two thermally crosslinkable reactive groups introduced at one or both ends of the backbone; either a crosslinking agent having thermally crosslinkable reactive groups at both ends thereof or an epoxy compound or both; and an organic solvent.

In another embodiment, a film can be produced by casting the thermosetting composition.

In another embodiment, a prepreg can be produced by impregnating the thermosetting composition into a reinforcing material.

In another embodiment, a printed circuit board includes the film or the prepreg.

In another embodiment, a storage medium includes the printed circuit board.

In an embodiment, a thermosetting composition includes an organic solvent, a liquid crystalline thermoset oligomer, and a crosslinking agent having crosslinkable reactive groups at both ends thereof, an epoxy compound, or both a crosslinking agent and an epoxy compound, wherein the liquid crystalline thermoset oligomer is represented by Formula 1:

  (1)

wherein $R^1$ is represented by Formula 2:

  (2)

wherein $X^1$ and $Y^1$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, substituted or unsubstituted $C_6$-$C_{30}$ aryl groups, and any combination thereof, and $Ar^1$ contains at least one divalent aromatic or alicyclic organic group selected from the group consisting of:

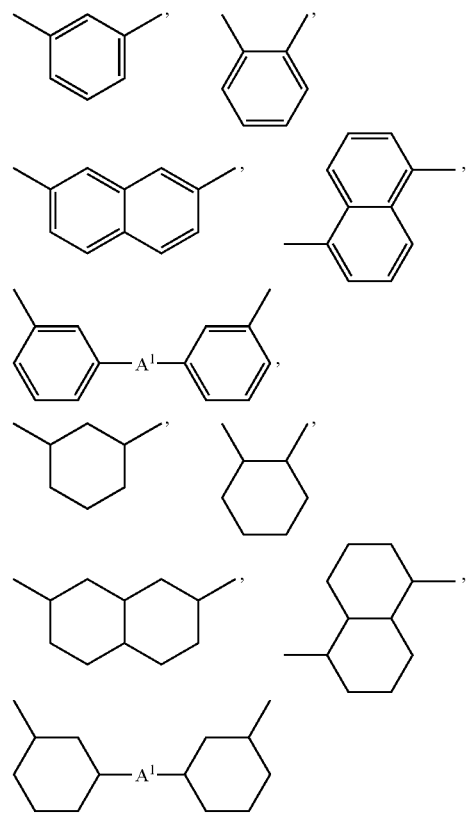

and any combination thereof, wherein at least one of the carbon atoms present in each of the aromatic and aliphatic rings is optionally replaced by a heteroatom selected from the group consisting of N, O, S, P, and any combination thereof, and $A^1$ represents a single bond or is —O—, —S—, —C(O)—, —S(O)—, —S(O)$_2$—, a divalent aliphatic or aromatic organic group, or any combination thereof, $R^2$ is represented by Formula 6:

  (6)

wherein $X^2$ and $Y^2$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, substituted or unsubstituted $C_6$-$C_{30}$ aryl groups, and any combination thereof, and $Ar^3$ contains at least one divalent aromatic or alicyclic group selected from the group consisting of:

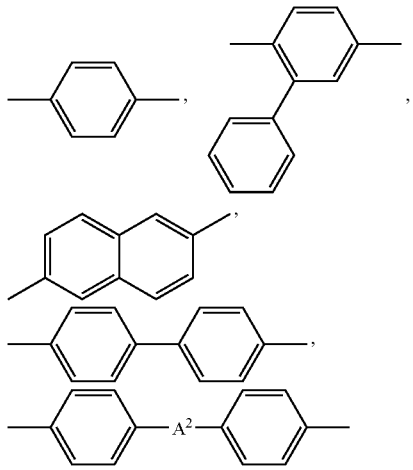

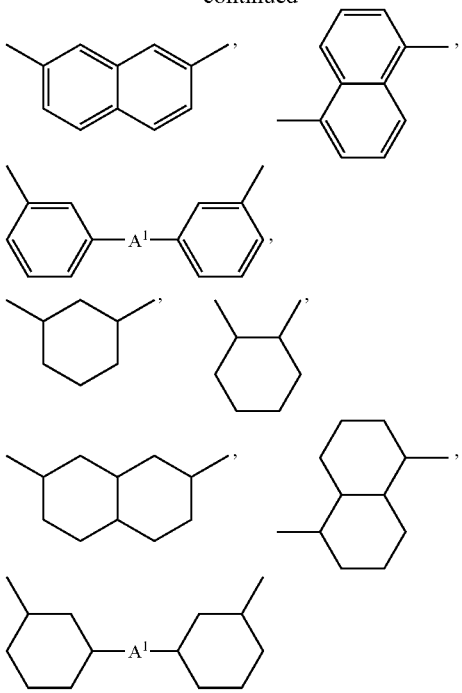

and any combination thereof, wherein the aromatic and alicyclic rings contain only carbon atoms, or wherein at least one of the carbon atoms present in each of the aromatic and alicyclic rings is replaced by a heteroatom selected from the group consisting of N, O, S, P, and any combination thereof, and $A^2$ represents a single bond or is —$N_2$—, —O—, —S—, —C(O)—, —S(O)—, —S(O)$_2$—, a divalent aliphatic or aromatic organic group, and any combination thereof, $Z^1$ and $Z^2$ are each independently a thermally crosslinkable reactive group having a terminal multiple bond, and m and n are each independently an integer from about 1 to about 50.

In an embodiment, a cured resin product includes cure product of a crosslinking agent having crosslinkable reactive groups at both ends thereof, an epoxy compound, or both a crosslinking agent and an epoxy compound, and a liquid crystalline thermoset oligomer of Formula 1:

 (1)

wherein $R^1$ is represented by Formula 2:

—$X^1$—$Ar^1$—$Y^2$— (2)

wherein $X^1$ and $Y^1$ are each independently selected from the group consisting of —O—, —C(O)—, —NR", and any combination thereof, wherein R" is selected from the group consisting of a hydrogen atom, substituted or unsubstituted $C_1$-$C_{20}$ alkyl groups, and substituted or unsubstituted $C_6$-$C_{30}$ aryl groups, and any combination thereof, and $Ar^1$ contains at least one divalent aromatic or alicyclic organic group selected from the group consisting of:

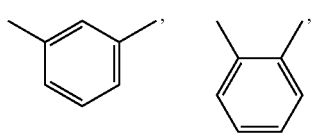

and any combination thereof, wherein the aromatic and alicyclic rings contain only carbon atoms, or wherein at least one carbon atom present in each of the aromatic and aliphatic rings is replaced by a heteroatom selected from the group consisting of N, O, S, P, and any combination thereof, and $A^1$ represents a single bond or is —O—, —S—, —C(O)—, —S(O)—, —S(O)$_2$—, a divalent aliphatic or aromatic organic group, and any combination thereof, $R^2$ is represented by Formula 6:

—$X^2$—$Ar^3$—$Y^2$— (6)

wherein $X^2$ and $Y^2$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, and substituted or unsubstituted $C_6$-$C_{30}$ aryl groups, and any combination thereof, and $Ar^3$ contains at least one divalent aromatic or alicyclic group selected from the group consisting of:

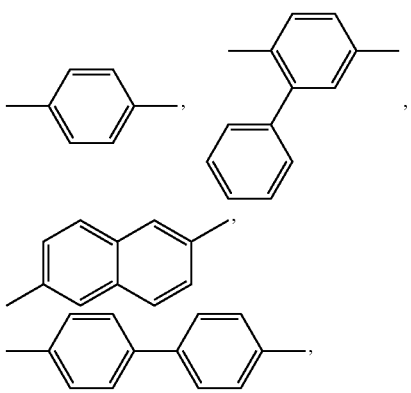

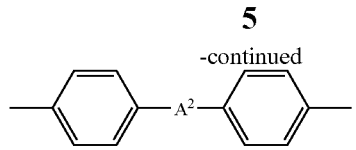

and any combination thereof, wherein the aromatic and alicyclic rings contain only carbon atoms, or wherein at least one of the carbon atoms present in each of the aromatic and alicyclic rings is replaced by a heteroatom selected from the group consisting of N, O, S, P, and any combination thereof, and $A^2$ represents a single bond or is —$N_2$—, —O—, —S—, —C(O)—, —S(O)—, —$S(O)_2$—, a divalent aliphatic or aromatic organic group, and any combination thereof, $Z^1$ and $Z^2$ are each independently a thermally crosslinkable reactive group having a terminal multiple bond, and m and n are each independently an integer from about 1 to about 50.

In an embodiment, a prepreg includes a cured resin product of a liquid crystalline thermoset oligomer, and a crosslinking agent having crosslinkable reactive groups at both ends thereof, an epoxy compound, or both a crosslinking agent and an epoxy compound, wherein the liquid crystalline thermoset oligomer is represented by Formula 1:

(1)

wherein $R^1$ is represented by Formula 2:

(2)

wherein $X^1$ and $Y^1$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, substituted or unsubstituted $C_6$-$C_{30}$ aryl groups and any combination thereof, and $Ar^1$ contains at least one divalent aromatic or alicyclic organic group selected from the group consisting of:

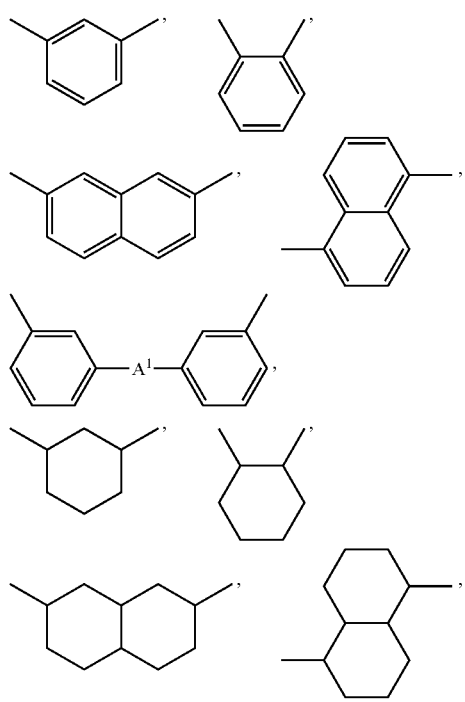

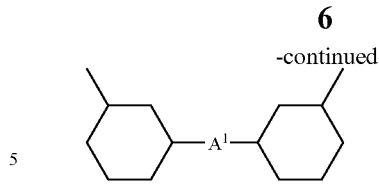

and any combination thereof, wherein at least one of the carbon atoms present in each of the aromatic and aliphatic rings is optionally replaced by a heteroatom selected from the group consisting of N, O, S, P, and any combination thereof, and $A^1$ represents a single bond or is —O—, —S—, —C(O)—, —S(O)—, —$S(O)_2$—, a divalent aliphatic or aromatic organic group, or any combination thereof, $R^2$ is represented by Formula 6:

$$-X^2-Ar^3-Y^2- \qquad (6)$$

wherein $X^2$ and $Y^2$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, substituted or unsubstituted $C_6$-$C_{30}$ aryl groups, and any combination thereof, and $Ar^3$ contains at least one divalent aromatic or alicyclic group selected from the group consisting of:

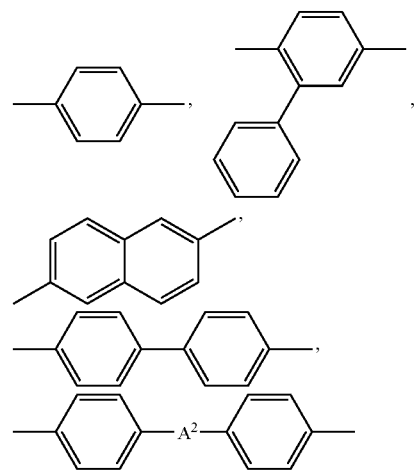

and any combination thereof, wherein the aromatic and alicyclic rings contain only carbon atoms, or wherein at least one of the carbon atoms present in each of the aromatic and alicyclic rings is replaced by a heteroatom selected from the group consisting of N, O, S, P, and any combination thereof, and $A^2$ represents a single bond or is —$N_2$—, —O—, —S—, —C(O)—, —S(O)—, —$S(O)_2$—, a divalent aliphatic or aromatic organic group, and any combination thereof, $Z^1$ and $Z^2$ are each independently a thermally crosslinkable reactive group having a terminal multiple bond, and m and n are each independently an integer from about 1 to about 50; and a reinforcing material selected from the group consisting of woven glass cloth, woven alumina glass fibers, glass fiber non-woven fabrics, cellulose non-woven fabrics, woven carbon fibers, polymer fabrics, and any combination thereof, wherein the cured resin product penetrates and is attached to the reinforcing material or is positioned on the surface of the reinforcing material, and wherein the amount of the cured resin product impregnated in the prepreg is from 50 to 70 wt %, based on the total weight of the prepreg.

In another embodiment, a method of forming a prepreg, includes coating a reinforcing material with the thermosetting composition, drying the coated reinforcing material, and curing the coated reinforcing material.

BRIEF DESCRIPTION OF THE DRAWINGS

The exemplary embodiments will be more clearly understood from the following detailed description taken in conjunction with the accompanying drawings, where.

DETAILED DESCRIPTION

Figure 1:
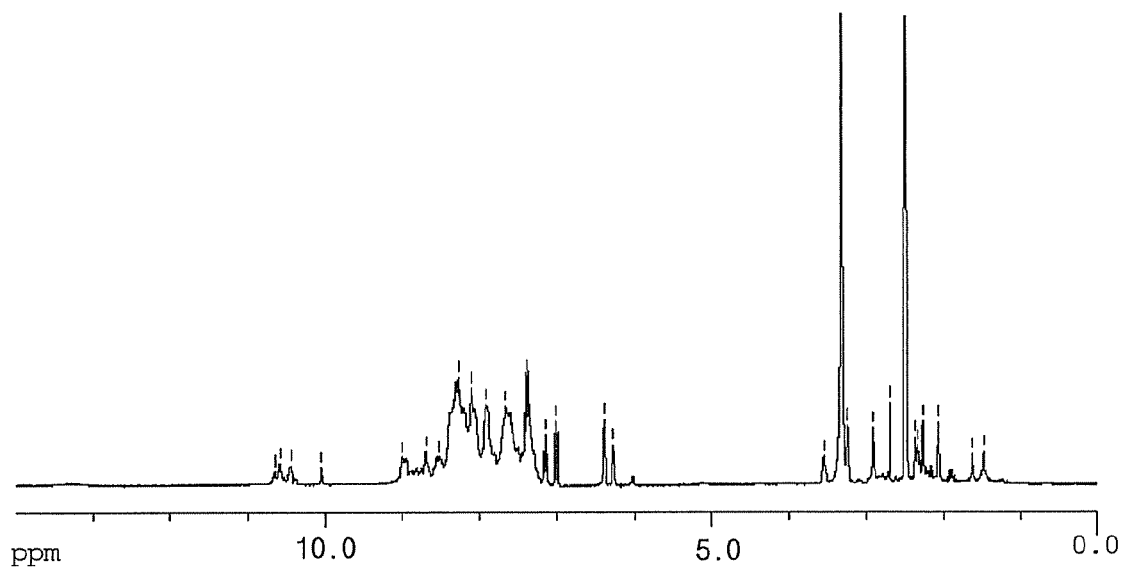
FIG. 1 is a $^1$H nuclear magnetic resonance ("NMR") spectrum of an exemplary liquid crystalline thermoset oligomer end-capped with nadimide, which is prepared in Synthesis Example 1.

Exemplary embodiments will now be described in greater detail hereinafter with reference to the accompanying drawings, in which embodiments of the invention are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or one or more intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "substituted" as used herein, unless otherwise specified, means that the groups are substituted with one or more groups selected from the group consisting of halogen atoms, $C_1$-$C_{20}$ alkyl groups, $C_1$-$C_{20}$ alkoxy groups, $C_6$-$C_{30}$ aryl groups, $C_6$-$C_{30}$ aryloxy groups, and any combination thereof.

Unless otherwise specified, the groups "alkyl", "alkenyl", "alkynyl", "alkylene", "alkenylene", "alkynylene", "cycloalkylene", "cycloalkenylene", "cycloalkynylene", "alkoxy" and "alkoxylene" as used herein represent $C_1$-$C_{20}$ alkyl, $C_2$-$C_{20}$ alkenyl, $C_2$-$C_{20}$ alkynyl, $C_2$-$C_{20}$ alkylene, $C_2$-$C_{20}$ alkenylene, $C_2$-$C_{20}$ alkynylene, $C_3$-$C_{20}$ cycloalkylene, $C_3$-$C_{20}$ cycloalkenylene, $C_3$-$C_{20}$ cycloalkynylene, $C_1$-$C_{20}$ alkoxy and $C_2$-$C_{20}$ alkoxylene, respectively. The groups "aryl", "arylene", "aryloxy" and "oxyarylene" represent $C_6$-$C_{30}$ aryl, $C_6$-$C_{30}$ arylene, $C_6$-$C_{30}$ aryloxy and $C_6$-$C_{30}$ oxyarylene, respectively.

Unless otherwise specified, the groups "heteroarylene" and "oxyheteroarylene" as used herein refer to arylene and oxyarylene groups in which at least one of the CH moieties present in the arylene ring is replaced by a heteroatom selected from the group consisting of N, O, S, P, and any combination thereof. The groups "heterocycloalkylene", "heterocycloalkenylene" and "heterocycloalkynylene" refer to cycloalkylene, cycloalkenylene and cycloalkynylene groups in which at least one of the $CH_2$, CH and C moieties present in the cycloalkylene, cycloalkenylene and cycloalkynylene rings is replaced by a heteroatom selected from the group consisting of N, O, S, P, and any combination thereof. It will also be understood that "backbone" as used herein, refers to the main polymer chain.

According to an exemplary embodiment, a thermosetting composition includes a liquid crystalline thermoset oligomer and an organic solvent wherein the liquid crystalline thermoset oligomer contains at least one aromatic or alicyclic structural unit with a kink structure in the backbone and has one or two thermally crosslinkable reactive groups at one or both ends of the backbone. In a specific embodiment, the aromatic or alicyclic structural unit comprises a 6-membered ring structure, or a fused ring structure based on 6-membered rings, either aromatic, aliphatic, or a combination thereof. In an exemplary embodiment, the aromatic structural units may be substituted or unsubstituted phenylene or naphthalene structures, and the alicyclic structural units may be substituted or unsubstituted cyclohexylene or decalinene structural units.

In one exemplary embodiment, the thermosetting composition may include either a crosslinking agent having thermally crosslinkable reactive groups at both ends thereof, or an epoxy compound or both.

In an exemplary embodiment, the liquid crystalline thermoset oligomer contains at least one mesogen structural unit in the backbone. In an exemplary embodiment, the liquid crystalline thermoset oligomer contains one or two thermally crosslinkable reactive groups at one or both ends of the backbone.

In an exemplary embodiment, the liquid crystalline thermoset oligomer may be represented by Formula 1:

$$Z^1\text{--}[\text{--}R^1\text{--}]_n\text{--}[\text{--}R^2\text{--}]_m Z^2 \tag{1}$$

wherein $R^1$ is an aromatic or alicyclic structural unit having a kink structure, $R^2$ is a mesogen structural unit, $Z^1$ and $Z^2$ are each independently a thermally crosslinkable reactive group having a terminal multiple bond, and m and n are each independently an integer from 1 to 50.

In an exemplary embodiment, the aromatic or alicyclic structural unit having a kink structure may be an aromatic or alicyclic group having two linking groups located 1,2 or 1,3 (e.g., in the ortho or meta position for a 6-membered aromatic group) relative to each other. The aromatic or alicyclic structural unit having a kink structure may be introduced into the backbone of the liquid crystal oligomer as a repeating unit. The introduction of the kink structure reduces the linearity of the backbone of the liquid crystalline thermoset oligomer. The reduced linearity reduces the interaction between backbones of adjacent liquid crystalline thermoset oligomers and thereby reduces the crystallinity of the liquid crystalline thermoset oligomer, resulting in improved solubility of the liquid crystalline thermoset oligomer in a solvent.

In an exemplary embodiment, the aromatic or alicyclic structural unit $R^1$ having a kink structure may be represented by Formula 2:

$$\text{--}X^1\text{--}Ar^1\text{--}Y^1\text{--} \tag{2}$$

wherein $X^1$ and $Y^1$ are each independently selected from the group consisting of —O—, —C(O)— and —NR''— (in which R'' is selected from the group consisting of a hydrogen atom, substituted or unsubstituted $C_1$-$C_{20}$ alkyl groups, substituted or unsubstituted $C_6$-$C_{30}$ aryl groups, and any combination thereof), and $Ar^1$ contains at least one divalent aromatic or alicyclic organic group selected from the group consisting of Formula (3):

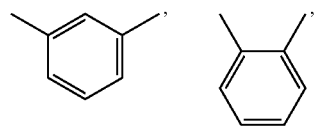

(3)

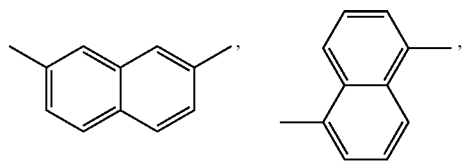

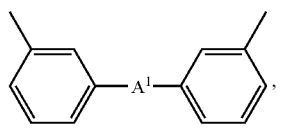

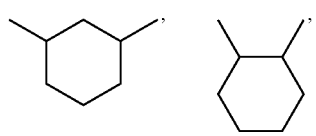

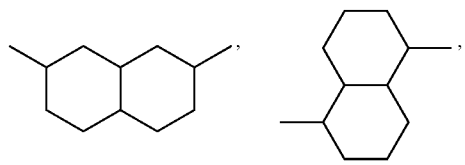

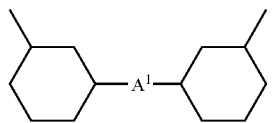

and any combination thereof, wherein at least one of the carbon (C) atoms present in each of the aromatic and aliphatic rings may be replaced by a heteroatom selected from the group consisting of N, O, S, P, and any combination thereof, at least one or more hydrogen atoms on the rings may be substituted, and $A^1$ represents a single bond, —O—, —S—, —C(O)—, —S(O)—, —S(O)$_2$— or a divalent aliphatic or aromatic organic group.

In an exemplary embodiment, the divalent aliphatic or aromatic organic group of Formula 3 is selected from the group consisting of substituted or unsubstituted $C_2$-$C_{20}$ alkylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a linking group represented by Formula 3a:

(3a)

wherein at least one of the CH moieties present in the aromatic ring may be replaced by a heteroatom selected from the group consisting of N, O, S, P, and any combination thereof, and a linking group represented by Formula 3b:

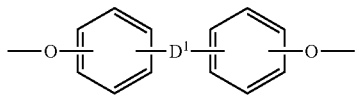
(3b)

wherein at least one of the CH moieties present in the aromatic rings may be replaced by a heteroatom selected from the group consisting of N, O, S, P, and any combination thereof, and $D^1$ is selected from —O—, —S—, —C(O)—, —S(O)—, —S(O)$_2$—, and linear or branched $C_2$-$C_{20}$ alkylene groups.

In an exemplary embodiment, the aromatic or alicyclic structural unit $R^1$ having a kink structure may be selected from the group consisting of Formula 4:

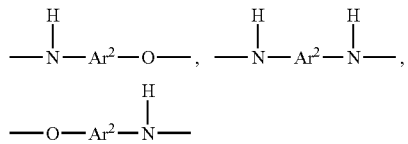
(4)

and any combination thereof, wherein each $Ar^2$ is selected from the group consisting of Formula 5:

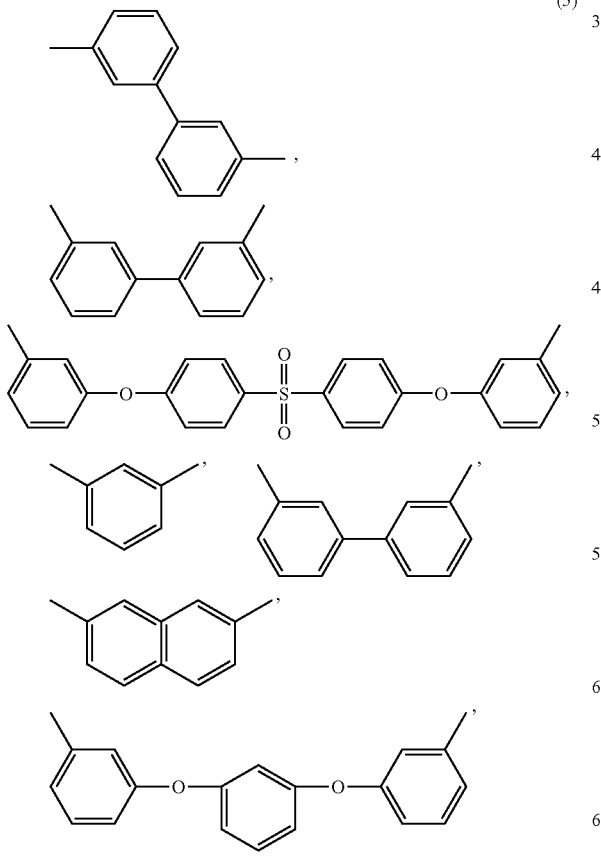
(5)

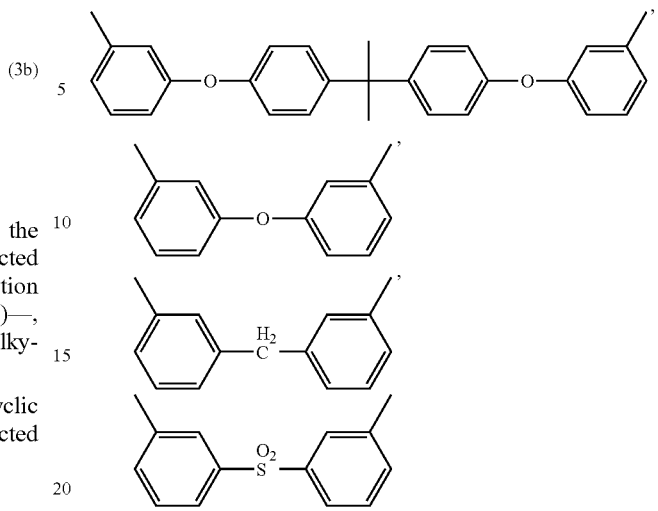

and any combination thereof. In an exemplary embodiment, the mesogen structural unit $R^2$ in Formula 1 may be represented by Formula 6:

(6)

wherein $X^2$ and $Y^2$ are each independently selected from the group consisting of —O—, —C(O)— and —NR"— (in which R" is selected from the group consisting of a hydrogen atom, substituted or unsubstituted $C_1$-$C_{20}$ alkyl groups, and substituted or unsubstituted $C_6$-$C_{30}$ aryl groups), and $Ar^3$ contains at least one divalent aromatic or alicyclic organic group selected from the group consisting of Formula 7:

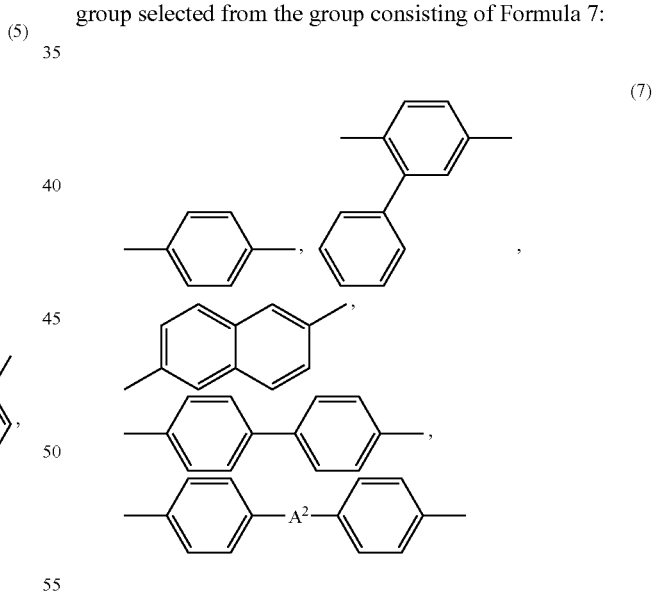
(7)

and any combination thereof wherein at least one of the carbon (C) atoms present in each of the aromatic and alicyclic rings may be replaced by a heteroatom selected from the group consisting of N, O, S, P, and any combination thereof, at least one or more hydrogen atoms on the rings may be substituted, and $A^2$ represents a single bond, —N$_2$— (i.e., —N=N—), —O—, —S—, —C(O)—, —S(O)—, —S(O)$_2$—, or a divalent aliphatic or aromatic organic group.

In an exemplary embodiment, the divalent aliphatic or aromatic organic group in Formula 7 is selected from the group consisting of substituted or unsubstituted $C_2$-$C_{20}$ alkylene groups, substituted or unsubstituted $C_2$-$C_{20}$ alkenylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a group represented by Formula 8a or a group of Formula 8b:

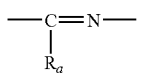 (8a)

wherein $R_a$ is a hydrogen atom, a halogen atom, a $C_1$-$C_5$ alkyl group or a $C_1$-$C_5$ haloalkyl group, and

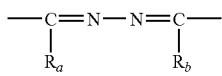 (8b)

wherein $R_a$ and $R_b$ are each independently a hydrogen atom, a halogen atom, a $C_1$-$C_5$ alkyl group or a $C_1$-$C_5$ haloalkyl group, and any combination thereof.

In an exemplary embodiment, the mesogen structural unit may be selected from the group consisting of:

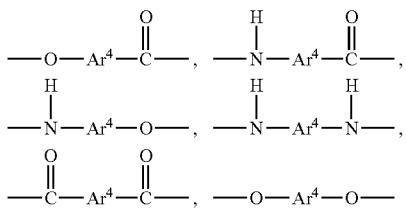 (9)

wherein each $Ar^4$ is selected from the group consisting of Formula 10:

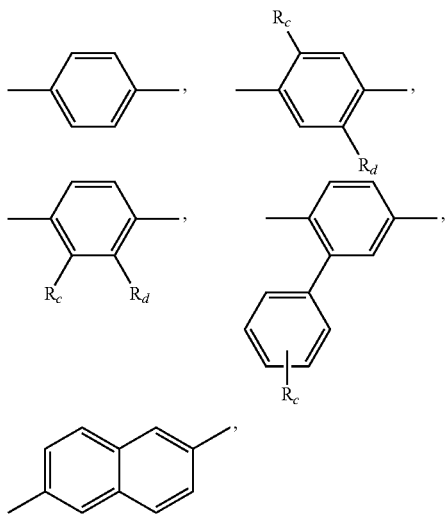 (10)

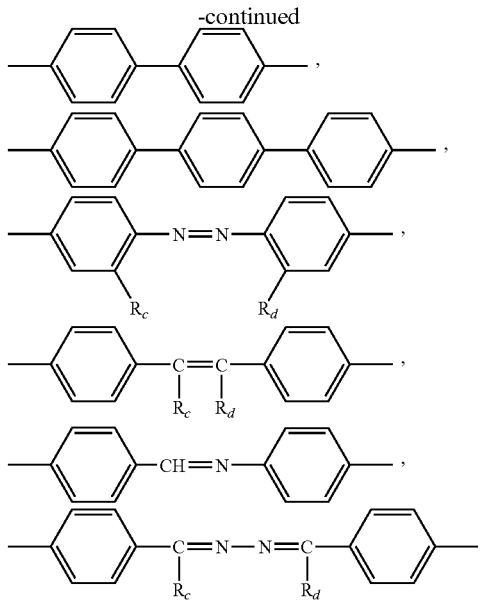

and any combination thereof, wherein $R_c$ and $R_d$ are each independently a proton, a $C_1$-$C_5$ alkyl group or a halogen group, and any combination thereof.

In an exemplary embodiment, the content of the aromatic or alicyclic structural unit having a kink structure in the liquid crystalline thermoset oligomer may be greater than 5 mole %, specifically greater than or equal to 10 mole %, and less than or equal to 60 mole %, specifically 55 mole %, based on the total moles of all the structural units. That is, n/(n+m+2) in Formula 1 may be greater than 0.05 but not greater than 0.6. Where the content of the aromatic or alicyclic structural unit having a kink structure is not greater than 5 mole % (i.e., is less than or equal to 5 mole %), the solubility of the liquid crystalline thermoset oligomer in a solvent may be extremely low. Where the content of the aromatic or alicyclic structural unit having a kink structure exceeds 60 mole % (i.e., the content of the mesogen structural unit in the backbone of the liquid crystalline thermoset oligomer is lowered), the liquid crystalline thermoset oligomer may no longer have a liquid crystallinity, and therefore may exhibit a deterioration in desired mechanical and thermal properties.

The aromatic or alicyclic structural unit having a kink structure can be introduced into the backbone of the liquid crystalline thermoset oligomer by using an aromatic or alicyclic compound having two functional groups in the 1,2 or 1,3 (e.g., ortho or meta for an aromatic group) position relative to each other, as a monomer in the preparation of the liquid crystalline thermoset oligomer. The content of the aromatic or alicyclic structural unit having a kink structure can be controlled by varying the amount of the monomer corresponding to the kink repeating unit added in the preparation of the liquid crystalline thermoset oligomer. The structure, content, and the like, of the aromatic or alicyclic structural unit having a kink structure can be varied to control the characteristics (e.g., solubility and liquid crystallinity) of the liquid crystalline thermoset oligomer.

The structural units $R^1$ and $R^2$ in Formula 1 may be arranged randomly, in blocks or alternately in a repeating manner. Exemplary arrangements of $R^1$, $R^2$, $Z^1$ and $Z^2$ in Formula 1 may include repeating structural units of $Z^1R^1R^1R^1 \ldots R^2R^2R^2Z^2$, $Z^1R^1R^1R^2 \ldots R^1R^2R^2Z^2$, $Z^1R^1R^2R^2R^2 \ldots R^1R^2Z^2$ or $Z^1R^1R^2R^1R^2 \ldots R^1R^2Z^2$.

A thermally crosslinkable reactive group may be introduced to at least one end of the backbone of the liquid crystalline thermoset oligomer. The thermally crosslinkable reactive groups introduced at both ends of the backbone of the liquid crystalline thermoset oligomer may be identical to or different from each other. When the thermosetting composition undergoes high-temperature curing during the production of a board (e.g., a printed circuit board), the thermally crosslinkable reactive groups crosslink to form a stable, rigid network-like structure. Such crosslinking may desirably improve the mechanical properties of the cured board.

Examples of the thermally crosslinkable reactive groups include, but are not necessarily limited to, maleimide, nadimide, phthalimide, acetylene, citraconimide, propargyl ether, benzocyclobutene, cyanate, substituents and derivatives thereof, and any combination thereof. The "substituent" as used herein refers to a structure in which the end of the corresponding thermally crosslinkable reactive group is partially substituted with a suitable substituent, for example, an alkyl group, a halogen atom or an aryl group. The "derivative" as used herein refers to a structure in which a ring, for example, an aromatic or heteroaromatic group, is fused to the corresponding crosslinkable reactive group. Where the crosslinkable reactive group is a maleimide group, the substituents include structures in which at least one hydrogen atom in the double bond of the maleimide is substituted with an alkyl group (e.g., a methyl group), and the derivatives include structures in which the double bond of the maleimide is fused to a benzene or naphthalene ring.

In an exemplary embodiment, the thermally crosslinkable reactive groups $Z^1$ and $Z^2$ in Formula 1 may be each independently selected from the group consisting of Formula 11:

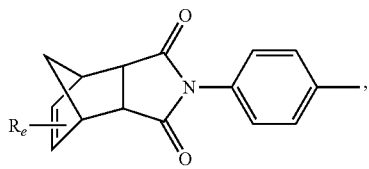
(11)

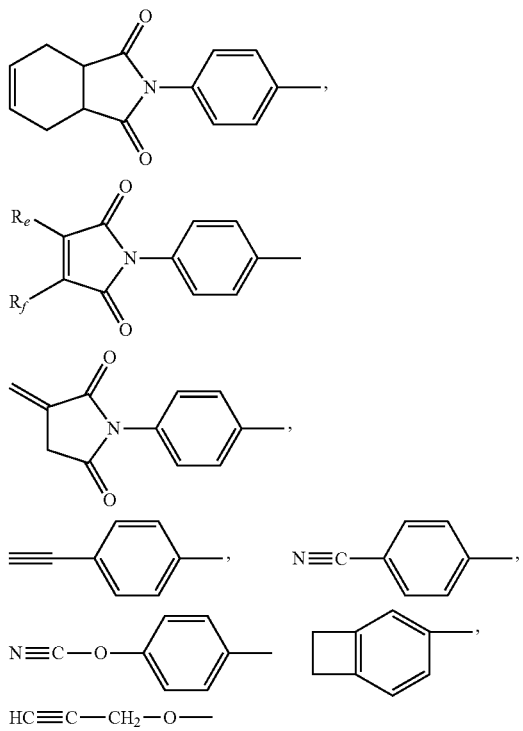

and any combination thereof, wherein $R_e$ and $R_f$ are each independently a proton, a $C_1$-$C_6$ alkyl group, a halogen, and any combination thereof.

In an exemplary embodiment, the liquid crystalline thermoset oligomer may have a structure of Formula 12a or 12b:

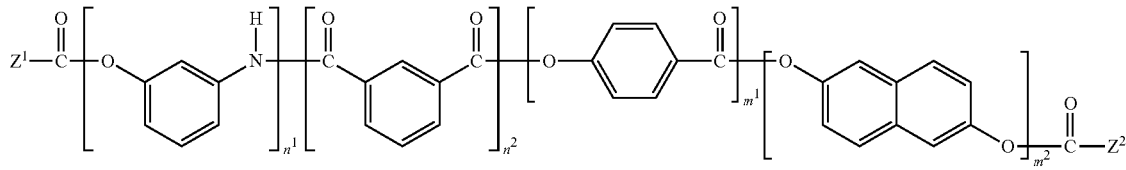
(12a)

wherein $Z^1$ and $Z^2$, which may be the same or different, are each independently selected from the group consisting of maleimide, nadimide, phthalimide, acetylene, citraconimide, propargyl ether, benzocyclobutene, cyanate, substituents and derivatives thereof, and any combination thereof, and $m^1$, $m^2$, $n^1$ and $n^2$ are each independently a positive integer, preferably an integer from 1 to 50, and satisfy the relations $1 \leq m^1+m^2 \leq 50$ and $1 \leq n^1+n^2 \leq 50$, specifically $0.05 < n^1+n^2/(n^1+n^2+m^1+m^2+2) \leq 0.6$;

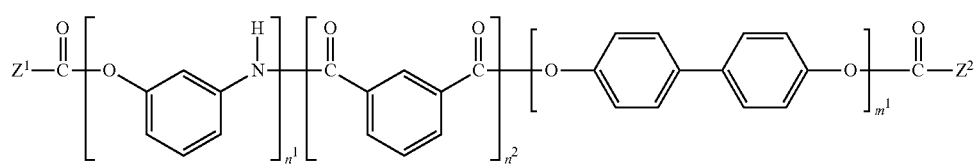
(12b)

wherein $Z^1$ and $Z^2$, which may be the same or different, are each independently selected from the group consisting of maleimide, nadimide, citraconimide, phthalimide, acetylene, propargyl ether, benzocyclobutene, cyanate, substituents and derivatives thereof, and any combination thereof, and $m^1$, $n^1$ and $n^2$ are each independently a positive integer, specifically an integer from 1 to 50, and satisfy the relations $1 \leq m^1 \leq 50$ and $1 \leq n^1 + n^2 \leq 50$, preferably $0.05 < n^1 + n^2/(m^1 + n^1 + n^2 + 2) \leq 0.6$.

Examples of the liquid crystalline thermoset oligomer may include, but are not necessarily limited to, structures of Formulae 13a to 13k:

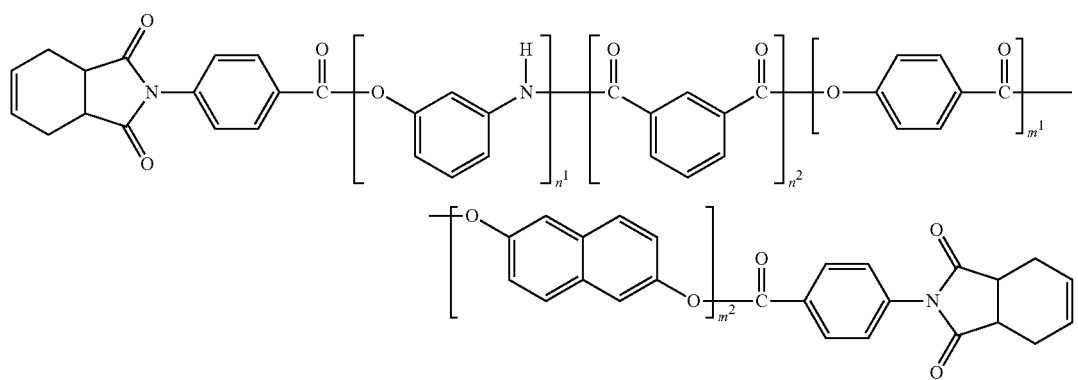

(13a)

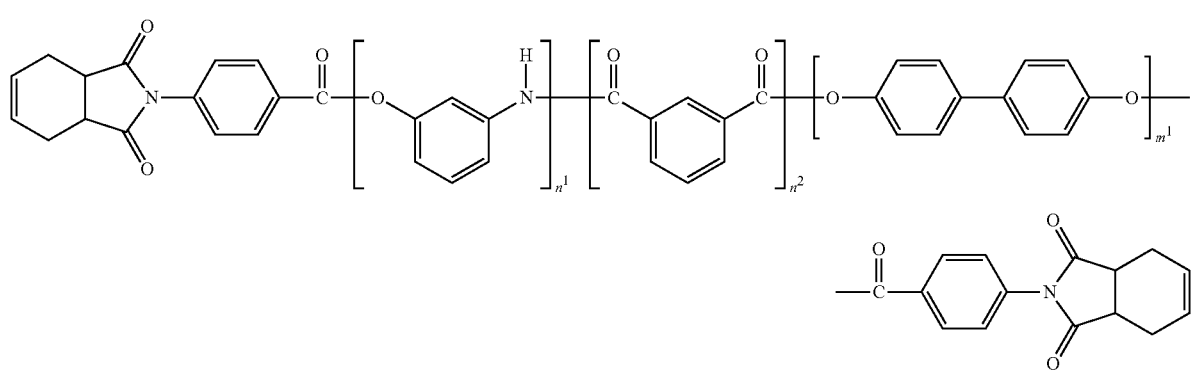

(13b)

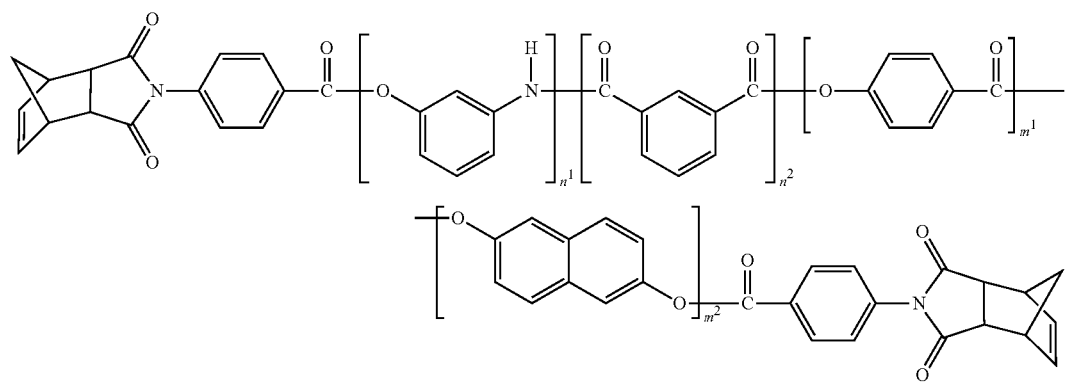

(13c)

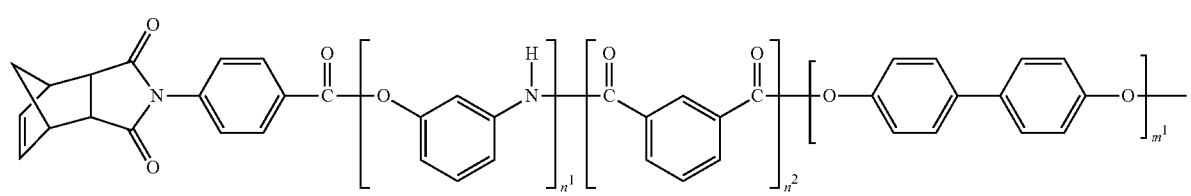

(13d)

-continued
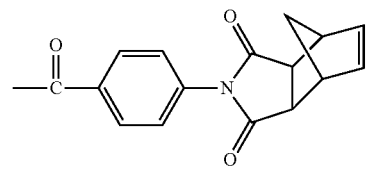
(13e)
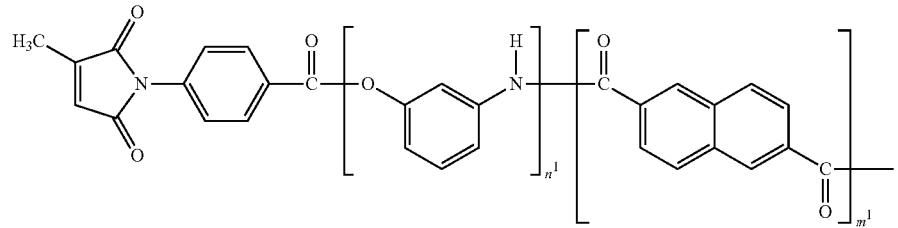
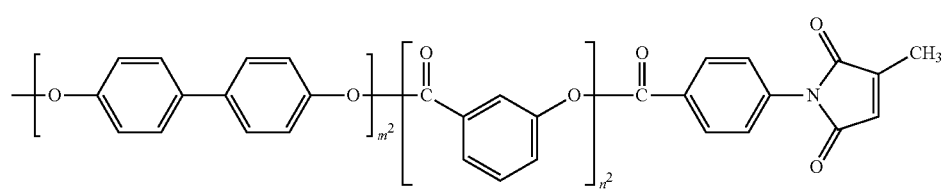
(13f)
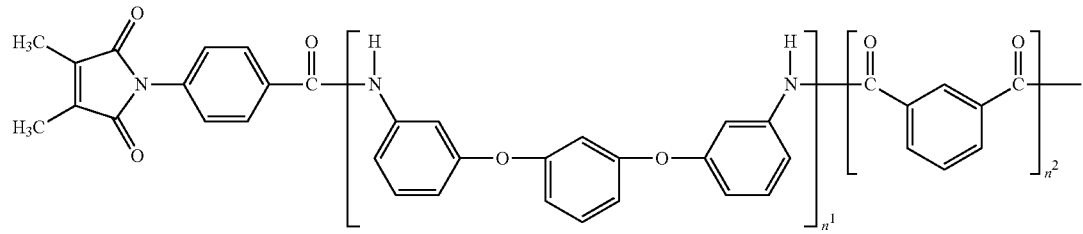
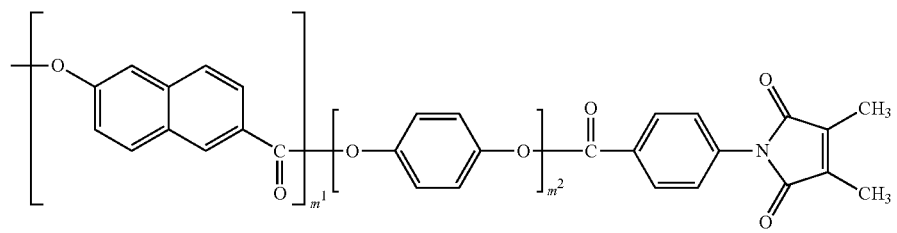
(13g)
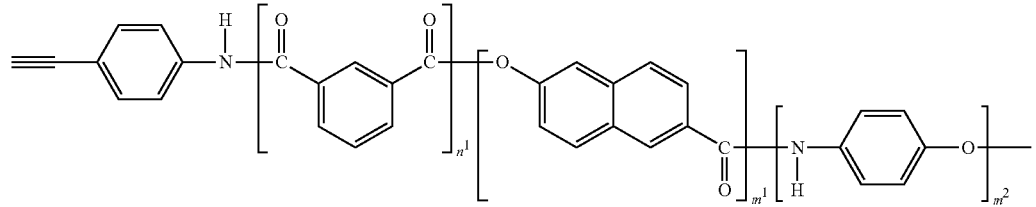
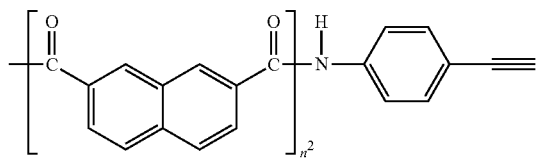
(13h)
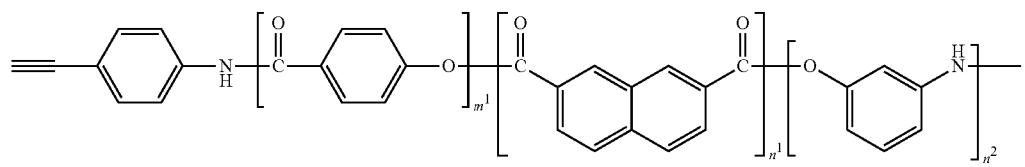

-continued
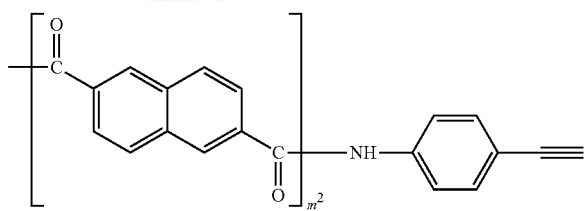
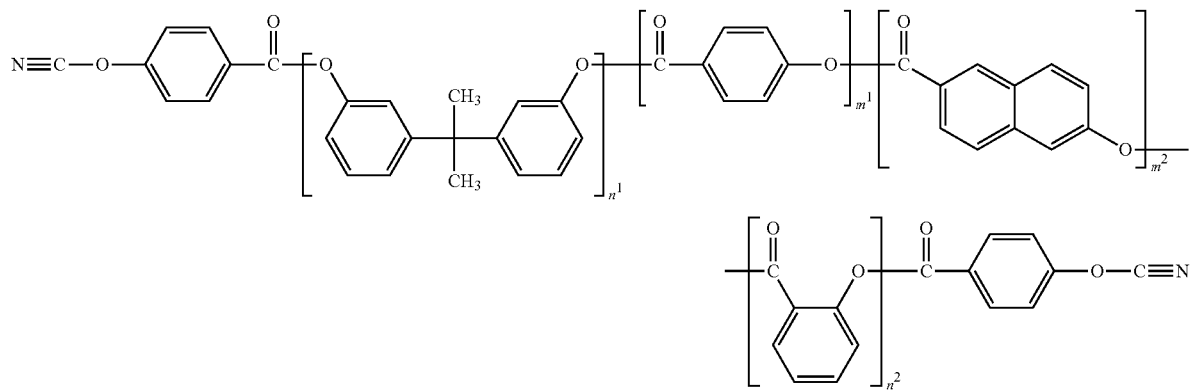
(13i)
(13j)
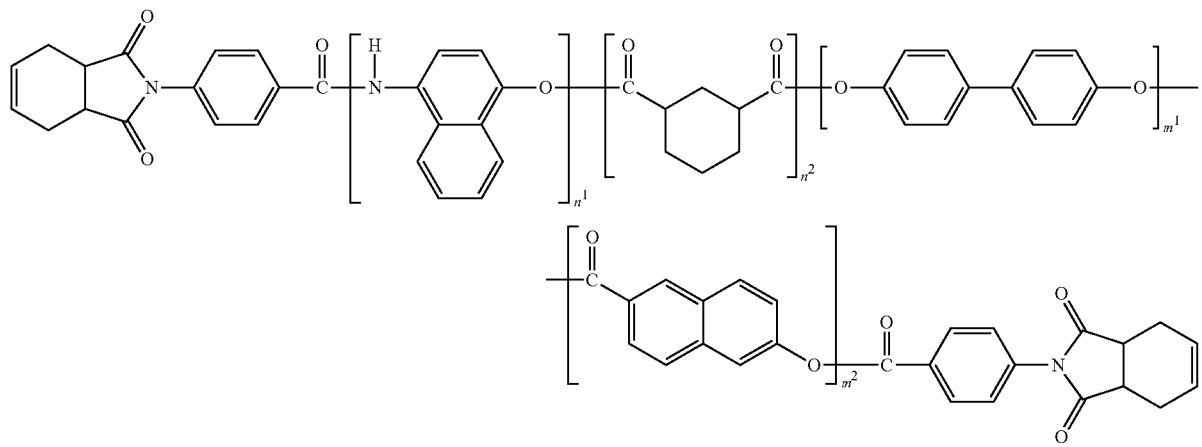
(13k)
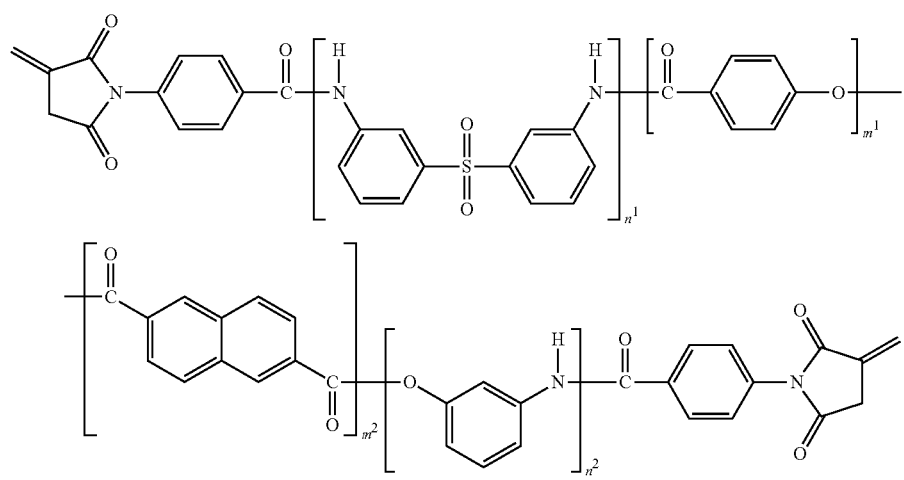

wherein $m^1$, $m^2$, $n^1$ and $n^2$ are each independently a positive integer, and specifically an integer from 1 to 50.

In an exemplary embodiment, the liquid crystalline thermoset oligomer may have a number average molecular weight (Mn) of 500 to 9,000. The liquid crystalline thermoset oligomer may have a number average molecular weight of 1,000 to 9,000. The liquid crystalline thermoset oligomer having a number average molecular weight lower than 500 is liable to be brittle due to its high crosslinking density. Conversely, dissolution of the liquid crystalline thermoset oligomer having a number average molecular weight higher than 15,000 in a solvent may undesirably increase the viscosity of the solution, resulting in poor processability.

There is no particular restriction on the preparation method of the liquid crystalline thermoset oligomer. For example, the liquid crystalline thermoset oligomer can be prepared by reacting a liquid crystal oligomer containing the aromatic or alicyclic structural unit having a kink structure and a mesogen structural unit with a compound capable of introducing the thermally crosslinkable reactive groups. The liquid crystal oligomer can be prepared by copolymerization of a monomer containing the aromatic or alicyclic structural unit having a kink structure with a monomer containing the mesogen structural unit.

No particular limitation is imposed on the monomer containing the aromatic or alicyclic structural unit having a kink structure and the monomer containing the mesogen structural unit. For example, each of the monomers may be selected from the group consisting of: aromatic, aromatic heterocyclic and aliphatic dicarboxylic acids; aromatic, aromatic heterocyclic and aliphatic diols; aromatic, aromatic heterocyclic and aliphatic diamines; aminophenols; hydroxybenzoic acids; aminobenzoic acids, and any combination thereof. Each of the monomers may be selected from the group consisting of aromatic diols, aromatic heterocyclic diols and aliphatic diols, aminophenols, aminobenzoic acids, and any combination thereof.

For example, solution polymerization or bulk polymerization can be carried out in a single reaction tank equipped with suitable stirring means to prepare the liquid crystalline thermoset oligomer.

The preparation of the liquid crystalline thermoset oligomer by solution polymerization will be explained below. In an exemplary method, isophthaloyl chloride, aminophenol, 2,6-dihydroxynaphthalene and triethylamine are reacted in a reactor with stirring at room temperature. After reacting for a predetermined time, the reaction mixture is further reacted with a compound (e.g., maleimidobenzoyl chloride, nadimidobenzoyl chloride, or acetylene benzoyl chloride) capable of providing thermally crosslinkable reactive groups (e.g., maleimide, nadimide or acetylene groups) to obtain a crude product. The crude product is isolated and purified to give the desired liquid crystalline thermoset oligomer.

Alternatively, the liquid crystalline thermoset oligomer can be prepared by a bulk polymerization process in accordance with the following procedure. In another exemplary method, isophthalic acid, aminophenol, 2-hydroxy-6-naphthoic acid and acetic anhydride are slowly heated to 150° C. with stirring in a reactor. The mixture is brought to reflux for a predetermined time period. Acetic acid as a by-product and unreacted acetic anhydride are removed from the reaction mixture. Next, 4-hydroxybenzoic acid is added, and the temperature is further raised to 320° C. and the reaction temperature is maintained which allows the reaction to proceed, to give a liquid crystal oligomer having one or two terminal alcohol groups at one or both ends of the backbone. The liquid crystal oligomer is dissolved in a proper solvent (e.g., N,N-dimethylformamide, abbreviated "DMF"), and then a compound (e.g., maleimidobenzoic acid, nadimide benzoic acid, or acetylene benzoic acid) capable of providing thermally crosslinkable reactive groups (e.g., maleimide, nadimide or acetylene groups) is added to the solution. The mixture is allowed to react to give the liquid crystalline thermoset oligomer having one or two thermally crosslinkable reactive groups at one or both ends of the backbone thereof.

Another bulk polymerization process for the preparation of the liquid crystalline thermoset oligomer can be carried out by the following procedure. In an exemplary method, isophthalic acid, aminophenol, 2-hydroxy-6-naphthoic acid and acetic anhydride are slowly heated to 150° C. with stirring in a reactor. The mixture is allowed to react at reflux for a predetermined time period. Acetic acid as a by-product and unreacted acetic anhydride are removed from the reaction mixture. Nadimidobenzoic acid is then added, the temperature is raised to 250° C. The mixture is maintained at this temperature and allowed to react to give the liquid crystalline thermoset oligomer.

The liquid crystalline thermoset oligomer is highly soluble in the organic solvent due to the introduction of the structural unit having a kink structure and its low molecular weight. This high solubility makes the liquid crystalline thermoset oligomer highly processable.

In an embodiment, a prepreg may be prepared using the liquid crystalline thermoset oligomer. A prepreg is a composite material produced by impregnating a polymer resin into a reinforcing material, such as a woven glass fiber or a carbon fiber but not limited to these, and drying the polymer resin. When a molten polymer is used as a prepreg material, high processing temperature and high melt viscosity of the molten polymer make it difficult to impregnate the molten polymer into a reinforcing material. An impregnating solution of a polymer in a solvent can also be used to produce a prepreg. If the polymer has a high molecular weight, the viscosity of the solution increases drastically with increasing concentration, making it difficult for the impregnating solution to have a high solid content and to effectively include sufficient polymer in the fiber. For example, an impregnating solution having a low solid content, when impregnated into the fiber and dried to remove the solvent, may result in only a small amount of the polymer resin included in the prepreg. That is, the use of the impregnating solution having a low solid content makes it difficult to achieve a sufficiently high resin content in the prepreg. Accordingly, it would be necessary to repeat the impregnation of the impregnating solution several times because one-time impregnation does not ensure an optimal amount of the polymer in the prepreg after drying. However, this repeated impregnation leads to low processing productivity. In contrast, high solubility of the liquid crystalline thermoset oligomer according to the exemplary embodiment of the present invention in the organic solvent enables the preparation of an impregnating solution with low viscosity even at high solids content. Therefore, the impregnation rate of the liquid crystalline thermoset oligomer, and hence process efficiency for the prepreg fabrication method, can be readily increased by one-time impregnation of the impregnating solution in the production of a prepreg. This ensures high productivity of the impregnation.

In an exemplary embodiment, the thermosetting composition may have a viscosity of 1,000 centipoise ("Cps") to 15,000 Cps at a solids content of about 50 weight percent ("wt %"). The liquid crystalline thermoset oligomer may be present in an amount of about 40 wt % to about 90 wt %, specifically about 45 wt % to about 85 wt %, and more specifically about 50 wt % to about 80 wt %, based on the total solids content of the thermosetting composition. The thermosetting composition may have a viscosity of 1,000 Cps to 10,000 Cps when the content of the liquid crystalline thermoset oligomer is about 40 wt % relative to the total solids content.

In an exemplary embodiment, the organic solvent may be a polar aprotic solvent. The organic solvent may be selected from the group consisting of N,N-dimethylacetamide, N-methylpyrrolidone ("NMP"), N-methylcaprolactam, N,N-dimethylformamide (DMF), N,N-diethylformamide, N,N-diethylacetamide, N-methylpropionamide, dimethylsulfoxide, γ-butyrolactone, dimethylimidazolidinone, tetramethylphosphoramide, and ethyl cellulose acetate. In another embodiment, a mixed solvent of the above-mentioned solvents may also be used.

In an embodiment, a thin film can be formed using a solution of the liquid crystalline thermoset oligomer in the organic solvent. High-temperature curing of the solution gives a crosslinked structure of the liquid crystalline thermoset oligomer. The crosslinked structure can improve the heat resistance and mechanical properties of the thin film. When a mixture of the liquid crystalline thermoset oligomer and a crosslinking agent having a low molecular weight is used, the terminal crosslinkable reactive groups of the liquid crystalline thermoset oligomer are copolymerized (i.e., are crosslinked) with the crosslinking agent to form a high-density crosslinked structure, which achieves improved heat resistance such as high coefficient of thermal expansion and high glass transition temperature.

The thermosetting composition can be used as a varnish for electronics applications with impregnation properties because of its high solids content in the organic solvent. The thermosetting composition can also be used for the production of a prepreg or copper clad laminate with high heat resistance and improved mechanical properties.

The crosslinking agent is resistant to heat. The crosslinking agent is thermally decomposed at a temperature as high as 200° C. The crosslinking agent may have a low molecular weight for higher crosslinking density. In one exemplary embodiment, the crosslinking agent has a molecular weight (number average molecular weight where the crosslinking agent is oligomeric) of 200 to 900.

The crosslinking agent may have thermally crosslinkable reactive groups at both ends thereof.

In an exemplary embodiment, the crosslinking agent may be represented by Formula 14:

$$Z^3\text{-}A^3\text{-}Z^4 \tag{14}$$

wherein $Z^3$ and $Z^4$ are each independently a monovalent crosslinkable organic group and $A^3$ is a linking group represented by Formula 15:

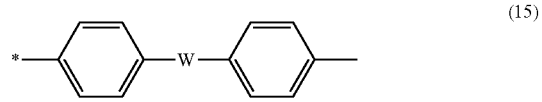

wherein W is selected from the group consisting of —O—, —S—, —C(O)—, —S(O)—, —S(O)$_2$—, substituted or unsubstituted $C_2$-$C_{20}$ alkylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a linking group represented by Formula 16a:

$$-B_1-Ar^5-B_2-\tag{16a}$$

wherein $B_1$ and $B_2$ are each independently selected from the group consisting of —O—, —S—, —C(O)—, —S(O)—, —S(O)$_2$—, —C(O)NH—, —C(O)O—, and any combination thereof, and $Ar^5$ is a divalent group comprising an aromatic group, and any combination thereof.

In an exemplary embodiment, $Ar^5$ in Formula 16a may be a linking group selected from the group consisting of Formula 16b:

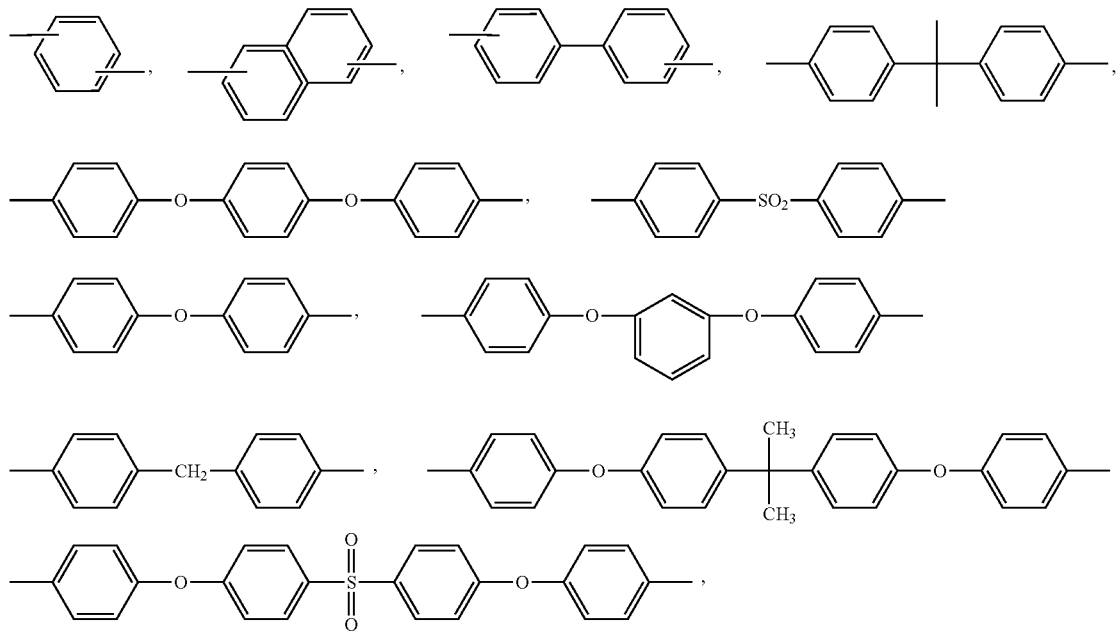

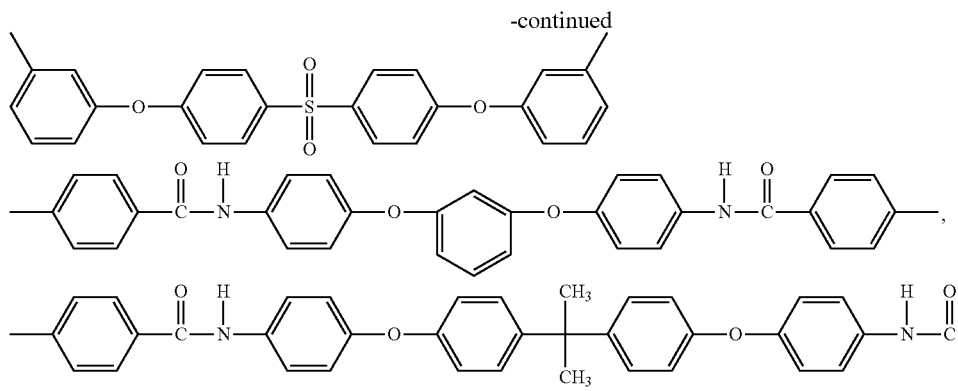

and any combination thereof. In one exemplary embodiment, $Z^3$ and $Z^4$ in Formula 14 may each be independently an end group selected from the group consisting of Formula 17:

(17)

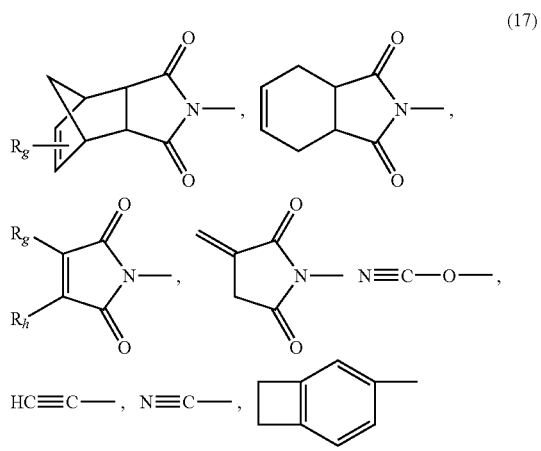

and any combination thereof, wherein $R_g$ and $R_h$ are each independently a proton, a $C_1$-$C_6$ alkyl group, a halogen, and any combination thereof.

Non-limiting examples of the crosslinking agent include bismaleimide, bis(methylmaleimide), bisnadimide, bis(methylnadimide), bisacetylene, bis(cyanate)ester, and bis(cyclobutene). These crosslinking agents may be used alone or as a mixture of two or more thereof.

There is no particular limitation on the mixing ratio of the liquid crystalline thermoset oligomer to the crosslinking agent. In an exemplary embodiment, the liquid crystalline thermoset oligomer and the crosslinking agent may be included in a weight ratio of 1:9 to 9:1, specifically 2:8 to 8:2, in the thermosetting composition.

In an exemplary embodiment, the thermosetting composition may further include an epoxy compound. The epoxy compound may be in the form of a resin. As the epoxy resin, there may be exemplified: phenolic glycidyl ether type epoxy resins, such as cresol novolac type epoxy resins, phenol novolac type epoxy resins, naphthol-modified novolac type epoxy resins, bisphenol A type epoxy resins, bisphenol F type epoxy resins, biphenyl type epoxy resins, and triphenyl type epoxy resins; alcoholic glycidyl type ether epoxy resins, such as polypropylene glycol glycidyl ether and hydrogenated bisphenol A type epoxy resins; dicyclopentadiene type epoxy resins having a dicyclopentadiene skeleton; naphthalene type epoxy resins having a naphthalene skeleton; dihydroxybenzopyran type epoxy resins; dihydroxydinaphthalene type epoxy resins; glycidyl ester type epoxy resins prepared from hexahydrophthalic anhydride or a dimer acid as a starting material; glycidylamine type epoxy resins prepared from a polyamine, such as diaminophenylmethane, as a starting material; alicyclic epoxy resins; brominated epoxy resins; and any combination thereof. These epoxy resins may be used alone or in combination of two or more thereof. The epoxy resin may be selected from the group consisting of biphenyl type epoxy resins, bisphenol type epoxy resins, stilbene type epoxy resins, phenolic novolac type epoxy resins, cresol novolac type epoxy resins and triphenolmethane type epoxy resins. In a specific embodiment, the epoxy resin may be selected from the group consisting of biphenyl type epoxy resins, bisphenol type epoxy resins, phenolic novolac type epoxy resins, cresol novolac type epoxy resins, and any combination thereof. In a more specific embodiment, the epoxy resin may be a biphenyl type epoxy resin.

In an exemplary embodiment, the thermosetting composition may include 5 to 200 parts by weight of the liquid crystalline thermoset oligomer, based on 100 parts by weight of the organic solvent. In an exemplary embodiment, the thermosetting composition may include 5 to 80 parts by weight of the crosslinking agent or the epoxy compound, based on 100 parts by weight of the organic solvent. In a specific exemplary embodiment, the liquid crystalline thermoset oligomer may be present in an amount of 10 to 70 parts by weight, i.e., not lower than 10 parts by weight but equal to or lower than 70 parts by weight, based on 100 parts by weight of the thermosetting composition. In a more specific exemplary embodiment, the liquid crystalline thermoset oligomer may be present in an amount of 20 to 60 parts by weight, based on 100 parts by weight of the thermosetting composition. In a still more specific exemplary embodiment, the liquid crystalline thermoset oligomer may be present in an amount of 30 to 50 parts by weight, based on 100 parts by weight of the thermosetting composition. Because of the high solubility of the liquid crystal oligomer, the solids content of the thermosetting composition may be at least as high as 30 parts by weight, based on 100 parts by weight of the thermosetting composition. In another exemplary embodiment, the solids content of the thermosetting composition may be at least 50 parts by weight but less than or equal to 70 parts by weight, based on 100 parts by weight of the thermosetting composition. In another exemplary embodiment, the liquid crystalline thermoset oligomer may be present in an amount of at least 40% by weight, based on the total solids content of the thermosetting composition.

In an exemplary embodiment, the thermosetting composition may further include a liquid crystal polymer or oligomer having one or two hydroxyl groups at one or both ends of the backbone. In an exemplary embodiment, the liquid crystal polymer or oligomer may have a backbone selected from the group consisting of aromatic polyester, aromatic polyester amide, aromatic polyamide backbones, and any combination thereof.

The liquid crystal polymer or oligomer having terminal hydroxyl groups may have a number average molecular weight (Mn) of about 1,000 to about 50,000. For example, the liquid crystal polymer may have a number average molecular weight of 10,000 to 50,000 and the liquid crystal oligomer may have a number average molecular weight of 1,000 to 9,000. The liquid crystal polymer or oligomer having terminal hydroxyl groups may be mixed with the liquid crystalline thermoset oligomer in a weight ratio of 90:10 to 10:90, specifically 85:15 to 15:85.

In an exemplary embodiment, the thermosetting composition may further include another liquid crystal polymer. This liquid crystal polymer may be a liquid crystal polymer without terminal hydroxyl groups. In an exemplary embodiment, the liquid crystal polymer may have a number average molecular weight of about 10,000 to about 500,000. Examples of the liquid crystal polymer include, but are not necessarily limited to, liquid crystal polymers that contain one or more mesogen groups selected from the group consisting of ester, ester-amide, ester-imide, ester-ether, ester-carbonate, and any combination thereof in the backbone. The liquid crystalline thermoset oligomer may be mixed with the liquid crystal polymer in a weight ratio of 99.5:0.5 to 35:65, specifically 99:1 to 40:70.

The liquid crystal polymer may be a liquid crystal polyester that has constituent monomer units selected from the group consisting of aromatic hydroxycarboxylic acids, aromatic dicarboxylic acids, aromatic diols, aromatic hydroxyamines, aromatic diamines, aromatic aminocarboxylic acids, and any combination thereof, and that forms an anisotropic melt phase. Particularly, the constituent monomer units of the liquid crystal polyester are selected from the group consisting of aromatic dicarboxylic acids, aromatic diols, aromatic hydroxycarboxylic acids, and any combination thereof. The liquid crystal polyester may be a liquid crystal polyester amide containing amide moieties in the molecular chain (i.e., the backbone).

Examples of the aromatic hydroxycarboxylic acids include 4-hydroxybenzoic acid, 3-hydroxybenzoic acid, 2-hydroxybenzoic acid, 2-hydroxy-6-naphthalenecarboxylic acid, 2-hydroxy-5-naphthalenecarboxylic acid, 3-hydroxy-2-naphthalenecarboxylic acid, 2-hydroxy-3-naphthalenecarboxylic acid, 4'-hydroxyphenyl-4-benzoic acid, 3'-hydroxyphenyl-4-benzoic acid, 4'-hydroxyphenyl-3-benzoic acid, alkyl, alkoxy and halogen substituents thereof, ester-forming derivatives thereof, and any combination thereof.

Examples of the aromatic dicarboxylic acids include terephthalic acid, isophthalic acid, 2,6-naphthalenedicarboxylic acid, 1,6-naphthalenedicarboxylic acid, 2,7-naphthalenedicarboxylic acid, 4,4'-dicarboxybiphenyl, bis(4-carboxyphenyl)ether, bis(4-carboxyphenoxy)butane, bis(4-bis(3-carboxyphenyl)ether, bis(3-carboxyphenyl)ethane, alkyl, alkoxy and halogen substituents thereof, ester-forming derivatives thereof, and any combination thereof.

Examples of the aromatic diols include hydroquinone, resorcinol, 2,6-dihydroxynaphthalene, 2,7-dihydroxynaphthalene, 1,6-dihydroxynaphthalene, 4,4'-dihydroxybiphenyl, 3,3'-dihydroxybiphenyl, 3,4'-dihydroxybiphenyl, 4,4'-dihydroxybiphenyl ether, bis(4-hydroxyphenyl)ethane, alkyl, alkoxy and halogen substituents thereof, ester-forming derivatives thereof, and any combination thereof.

Examples of the aromatic hydroxyamines include 4-aminophenol, N-methyl-4-aminophenol, 3-aminophenol, 3-methyl-4-aminophenol, 4-amino-1-naphthol, 4-amino-4'-hydroxydiphenyl, 4-ether, 4-amino-4'-hydroxybiphenylmethane, 4-amino-4'-hydroxybiphenylsulfide, 4,4'-diaminodiphenylsulfone, ester-forming derivatives thereof, and any combination thereof.

Examples of the aromatic diamines include 1,4-phenylenediamine, N-methyl-1,4-phenylenediamine, N,N'-dimethyl-1,4-phenylenediamine, 4,4'-diaminophenylsulfide(thiodianiline), 2,5-diaminotoluene, 4,4'-ethylenedianilne, 4,4'-diaminodiphenoxyethane, 4,4'-diaminobiphenylmethane (methylenedianiline), 4,4'-diaminobiphenyl ether (oxydianiline), ester-forming derivatives thereof, and any combination thereof.

Examples of the aromatic aminocarboxylic acids include 4-aminobenzoic acid, 2-amino-6-naphthalenecarboxylic acid, 2-amino-7-naphthalenecarboxylic acid, ester-forming derivatives thereof, and any combination thereof.

So long as the intrinsic characteristics of the thermosetting composition are not impaired, the thermosetting composition may further include one or more polymers selected from thermosetting resins, thermoplastic resins, oligomers and elastomers thereof, and any combination thereof. Polymers that are routinely used in the related art may be used without limitation. Examples of such polymers include phosphorus-based polymeric compounds, such as poly phosphoric acid ester and melamine phosphate, elastomers, such as nitrogenous compounds (e.g., melamine and benzoguanamine), oxazine ring-containing compounds, silicon compounds, polyimide, polyvinyl acetal, phenoxy resins, acrylic resins, acrylic resins having hydroxyl groups, acrylic resins having carboxyl groups, alkyd resins, thermoplastic polyurethane resins, polybutadiene, butadiene-acrylonitrile copolymers, polychloroprene, butadiene-styrene copolymers, polyisoprene, butyl rubbers, fluorinated rubbers, natural rubbers, thermoplastic resins, such as styrene-isoprene rubbers, acrylic rubbers, epoxidized butadiene, maleated butadiene, polyethylene, polypropylene, polyethylene-propylene copolymers, polyvinyl chloride, polyvinylidene chloride, polystyrene, polyvinyl toluene, polyvinyl phenol, acrylonitrile styrene (AS) resins, acrylonitrile butadiene styrene ("ABS") resins, methacrylate butadiene styrene ("MBS") resins, poly-4-fluoroethylene, fluoroethylene-propylene copolymers, 4-fluoroethylene-6-fluoroethylene copolymers, vinyl compound polymers (e.g., vinylidene fluoride), polycarbonate, polyester carbonate, polyphenylene ether, polysulfone, polyester, polyether sulfone, polyamide, polyamide imide, polyester imide, polyphenylene sulfite and low-molecular weight polymers thereof, polymers including (meth)acrylate, epoxy(meth)acrylate, poly(meth)acrylate (e.g., di(meth) acryloxybisphenol), styrene, vinylpyrrolidone, diacrylphthalate, divinylbenzene, polyallyl compounds (e.g., diallylbenzene, diallyl ether bisphenol, trialkenyl isocyanurate, dicyclopentadiene and prepolymers thereof), phenolic resins, monomers containing at least one polymerizable double bond (e.g., unsaturated polyesters) and prepolymers thereof, curable monomers and prepolymers (e.g., polyisocyanate), and any combination thereof.

The thermosetting composition may further include one or more additives selected from fillers, softeners, antioxidants, lubricants, antistatic agents, colorants, heat stabilizers, light stabilizers, coupling agents, flame retardants, auxiliary flame retardants, plasticizers, UV absorbers, and any combination thereof. Examples of the fillers are organic fillers, including resins such as epoxy, melamine, urea, benzoguanamine styrene resins, and any combination thereof.

Inorganic fillers that are routinely used in the related art may be used without limitation. Examples of such inorganic fillers include natural silica, fused silica, amorphous silica, hollow silica, metal hydroxides (such as aluminum hydroxide, boehmite and magnesium hydroxide), molybdenum compounds (such as molybdenum oxide and zinc molybdate), zinc borate, zinc stannate, aluminum borate, potassium titanate, magnesium sulfate, silicon carbide, zinc oxide, silicon nitride, silicon dioxide, aluminum titanate, barium titanate, barium strontium titanate, aluminum oxide, alumina, clay, kaolin, talc, calcined clay, calcined kaolin, calcined talc, mica, short glass fibers, and any combination thereof.

The antioxidants may be well-known ones, such as phosphorus-containing antioxidants, phenolic antioxidants and sulfur-containing antioxidants. These antioxidants may be used alone or as a mixture of two or more thereof.

The plasticizers may be well-known ones, such as polyethylene glycol, polyamide oligomers, ethylenebisstearamide, phthalic acid ester, polystyrene oligomers, liquid paraffin, polyethylene wax, and silicone oil. These plasticizers may be used alone or as a mixture of two or more thereof.

The flame retardants may be well-known ones, including brominated polymers, such as brominated polystyrene, brominated syndiotactic polystyrene and brominated polyphenylene ether, and brominated aromatic compounds, such as brominated diphenylalkane and brominated diphenyl ether. The auxiliary flame retardants may be well-known ones, including antimony compounds, such as antimony trioxide. These flame retardants and auxiliary flame retardants may be used alone or as a mixture of two or more thereof.

The thermosetting composition can be applied to a varnish for impregnation or coating applications.

In accordance with another exemplary embodiment, there is provided a cured resin product including a crosslinked product of the liquid crystalline thermoset oligomer and either the crosslinking agent or the epoxy resin or both.

The cured resin product can be produced by applying and drying the thermosetting composition. The cured resin product can be molded into a sheet or a board. Due to the presence of the crosslinkable functional groups at one or both ends of the backbone of the liquid crystalline thermoset oligomer and the use of the crosslinking agent or the epoxy resin in the thermosetting composition, thermal curing of the thermosetting composition can be effected to provide a high-density crosslinked structure to markedly improve the mechanical and thermal properties of the final product.

A prepreg can be produced using the thermosetting composition. The prepreg is produced by coating a reinforcing material with the thermosetting composition, drying the coated reinforcing material, and curing the coated reinforcing material. In an embodiment, coating may accomplished by applying the thermosetting composition to the surface of the reinforcing material. In another embodiment, the thermosetting composition may be impregnated into a reinforcing material. The coated reinforcing material is cured to produce a sheet-like prepreg.

The reinforcing material is not particularly limited. As the reinforcing material, there may be exemplified woven glass cloth, woven alumina glass fibers, glass fiber non-woven fabrics, cellulose non-woven fabrics, woven carbon fibers, polymer fabrics, and any combination thereof. Non-limiting examples of such reinforcing materials include: inorganic fibers, such as glass fibers, silica glass fibers, carbon fibers, alumina fibers, silicon carbide fibers, asbestos, rock wool, mineral wool, gypsum whisker, woven fabrics and non-woven fabrics thereof, and mixtures thereof; organic fibers, such as aromatic polyamide fibers, polyimide fibers, liquid crystal polyester, polyester fibers, fluorine fibers, and polybenzoxazole fibers; combined woven fabrics, such as glass fibers with polyamide fibers, glass fibers with carbon fibers, glass fibers with polyimide fibers, and glass fibers with liquid crystal aromatic polyester; inorganic papers, such as glass paper, mica paper and alumina paper; kraft paper; cotton paper; paper glass-combined paper; and mixed fibrous reinforcing materials composed of at least two of the above materials, and any combination thereof.

The prepreg can be produced by applying the thermosetting composition to the reinforcing material or impregnating the thermosetting composition into the reinforcing material, followed by drying to remove the solvent. The application, impregnation and drying may be carried out by methods known in the art. For example, the thermosetting composition may be coated on, applied to, or impregnated into the reinforcing material by methods such as for example, dip coating or roll coating.

The amount of the cured resin product in the reinforcing material (i.e., after being applied to or impregnated in and curing to form the prepreg) may be from 50 to 70 wt %, specifically 55 to 65 wt %, based on the total weight of the prepreg. If the resin is impregnated in an amount of less than 50 wt %, the adhesion of the prepreg to an adjacent prepreg may deteriorate. However, if the resin is impregnated in an amount of more than 70 wt %, the mechanical strength of the prepreg may be reduced and the dimensional stability of the prepreg may be degraded. The amount (wt %) of the resin impregnated implies the sum of the amount of the resin penetrating and attached to the reinforcing material and the amount of the resin layered on the surface of the reinforcing material, based on the total amount of the prepreg.

The prepreg has a desirably low coefficient of thermal expansion. In an exemplary embodiment, the prepreg may have a coefficient of thermal expansion less than or equal to 20 ppm/° C., specifically less than or equal to 15 ppm/° C., determined at a temperature of 50-150° C.

In accordance with another exemplary embodiment, there is provided a board including the cured resin product.

The board can be produced using the thermosetting composition. The board is not particularly limited, and examples thereof include constituent layers of multilayer boards, metal clad laminates and printed boards. The board may be a combination of the prepreg and a metal foil.

The board may have various forms. For example, the board may be in the form of a film or sheet. The film can be produced by forming the thermosetting composition into a thin film. Such film formation processes include, but are not limited to: cast molding in which the thermosetting composition is cast into a film; and dip molding in which an inorganic substrate (e.g., glass) or a fabric substrate is dipped in a varnish of the thermosetting composition, followed by molding into a film or sheet.

In an exemplary embodiment, the board may be laminated with a metal foil. The metal foil may be a foil of copper, aluminum, or an alloy thereof. The thickness of the metal foil may vary from 5 to 100 micrometers ("μm") depending on the desired application of the board. The metal foil may be bound to the surface of the resin laminate. The metal foil may be patterned. For example, a printed circuit board can be produced by circuit processing (e.g., etching) of the metal foil. A multilayer printed circuit board can be produced by stacking the metal foil-coated laminate on a printed laminate, followed by circuit processing.

The metal foil laminate may be produced by applying the thermosetting composition to a metal foil (e.g., a copper foil) or casting the thermosetting composition on a metal foil (e.g., a copper foil), removing the solvent, followed by annealing. The solvent may be removed by evaporation. For example, the evaporation is carried out by heating under reduced pressure or by flushing with a non-solvent such as water.

The thermosetting composition can be applied by various processes, including but not limited to roll coating, dip coating, spray coating, spin coating, curtain coating, slot coating, or screen printing. Fine impurities contained in the thermosetting composition in the form of a solution may be removed by filtration before application to or casting on the copper foil.

The printed circuit board may be produced by stacking an inner circuit board, the prepreg and a metal foil in accordance with a design specification, and melting/curing the prepreg under pressure and heat in a press to attach the metal foil to the inner board. The printed circuit board may have various structures. For example, the printed circuit board may include one or two conductive patterns formed on one or both sides of the prepreg. The printed circuit board may be a laminate of two or more prepregs.

The metal foil laminate can be used as an element of the printed circuit board. For example, the metal foil laminate may be a resin coated copper (RCC) or a copper clad laminate (CCL).

In accordance with yet another exemplary embodiment, there is provided a storage medium including the printed circuit board.

The printed circuit board can be employed in storage media, such as hard disc drives ("HDDs"), solid state drives ("SSDs"), memory sticks, and other devices. For example, the printed circuit board may be electrically connected to one or more memory chips mounted thereon through or without leads.

The recent demand for the slimness and high driving speed of storage mediums has led to high-density integration of printed circuit boards. Such high-density integration is achieved, for example, by stacking printed circuit boards, reducing the thickness of printed circuit boards, and reducing the diameter and interval of through-holes of printed circuit boards. Flash memory chips are responsible for higher driving speed of SSDs than general HDDs. For higher driving speed, printed circuit boards of SSDs should be thinner and more integrated than printed circuit boards used in general HDDs. However, when boards are reduced in thickness, it becomes difficult to ensure low dielectric properties and low thermal expansion of the boards at optimum levels. Surprisingly, the printed circuit boards according to the exemplary embodiments of the present invention can be usefully employed in next generation storage media, such as SSDs, due to their low thermal expansion and low dielectric properties.

The solid state device (SSD) may be a complementary metal-oxide-semiconductor (CMOS) device, a metal-oxide-semiconductor (MOS) device, a conductor-insulator-semiconductor ("CIS") device, an electro-optical device, a single-atom device, a single-molecule device, a single-hole device, a single-atom PN junction device, a single-molecule PN junction device, a single-electron device, a one-dimensional solid state device, a second-dimensional solid state device, or a three-dimensional solid state device.

A more detailed description of exemplary embodiments will be described with reference to the following examples. However, these examples are given merely for the purpose of illustration and are not to be construed as limiting the scope of the embodiments.

EXAMPLES

Synthesis Example 1

Synthesis of Liquid Crystalline Thermoset Oligomer End-Capped with Nadimide 3.27 g (0.03 mol) of 4-aminophenol, 4.66 g (0.025 mol) of 4,4-dihydroxybiphenyl and 18 ml of triethylamine are dissolved in 100 ml of DMF in a 250 ml flask. The flask is cooled to 0-5° C. in ice-water. 10.15 g (0.05 mol) of isophthaloyl chloride is added to the flask. The mixture is reacted at room temperature for 2 hr. 3.01 g (0.01 mol) of p-nadimidobenzoyl chloride is added to the reaction mixture. The reaction is allowed to proceed for 10 hr, yielding a liquid crystalline thermoset oligomer having one or two nadimide reactive groups introduced to one or both ends of the backbone. The $^1$H NMR spectrum of the liquid crystalline thermoset oligomer is shown in FIG. 1. The liquid crystalline thermoset oligomer has a number average molecular weight of 2,500, as measured by gel permeation chromatography ("GPC"). The viscosity of the liquid crystalline thermoset oligomer (40 wt % in NMP) is 1,600 Cps.

Synthesis Example 2

Figure 2:
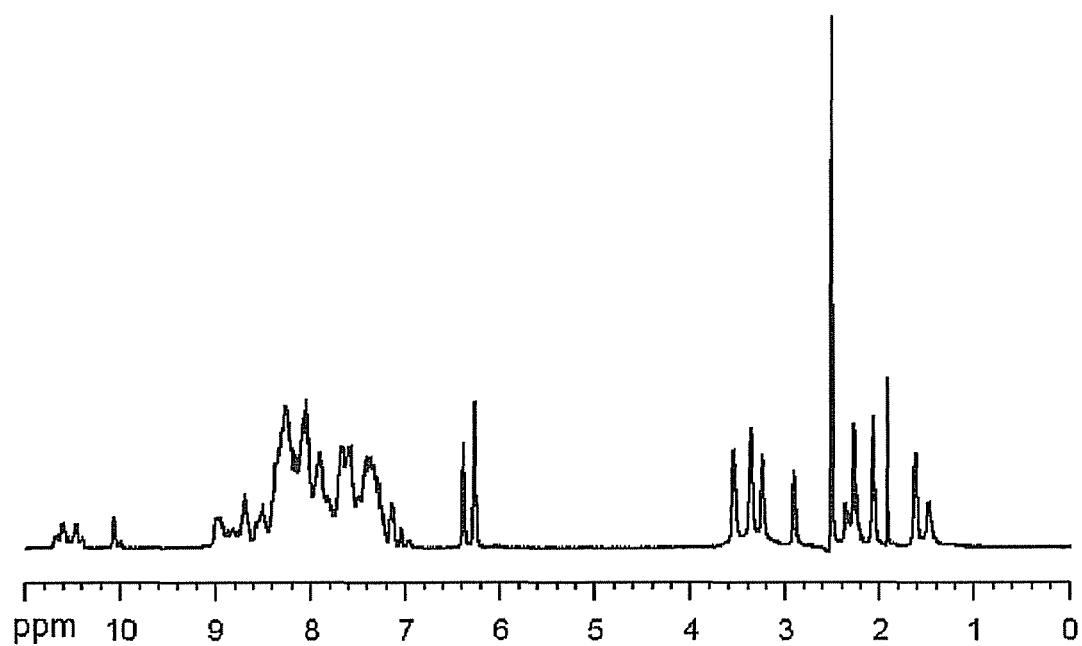
FIG. 2 is a $^1$H NMR spectrum of an exemplary liquid crystalline thermoset oligomer end-capped with nadimide, which is prepared in Synthesis Example 2.

Synthesis of Liquid Crystalline Thermoset Oligomer End-Capped with Nadimide 10.798 g (0.065 mol) of isophthalic acid, 23.974 g (0.127 mol) of 6-hydroxy-2-naphthoic acid, 17.60 g (0.127 mol) of 4-hydroxy-benzoic acid, 14.187 g (0.130 mol) of 4-aminophenol and 58.396 g (9.5 mol) of acetic anhydride are charged to a 500 ml flask equipped with a condenser and a mechanical stirrer. The mixture is slowly heated to 140° C. under a nitrogen atmosphere and is allowed to react (in an acetylation process) for 3 hr while maintaining the reaction temperature constant. After the subsequent addition of 36.79 g (0.130 mol) of N-(p-carboxyphenyl)nadimide, the mixture is heated to 215° C. at a rate of 1-2° C./min while removing acetic acid as a by-product and unreacted acetic anhydride. The reaction is continued for 4 hr at the same temperature, yielding a liquid crystalline thermoset oligomer having one or two nadimide reactive groups introduced into one or both ends of the backbone. The oligomer is isolated and pulverized to a finely divided powder using a pulverizer. The $^1$H NMR spectrum of the liquid crystalline thermoset oligomer is shown in FIG. 2.

Synthesis Example 3

Synthesis of Liquid Crystalline Thermoset Oligomer End-Capped with Methylmaleimide 3.3 g (0.03 mol) of 4-aminophenol, 3.7 g (0.02 mol) of 4,4-dihydroxybiphenyl and 18 ml of triethylamine are dissolved in 100 ml of DMF in a 250 ml flask. The flask is cooled to 0-5° C. in ice-water. 8.6 g (0.0425 mol) of isophthaloyl chloride is added to the flask. The mixture is reacted at room temperature for 2 hr. 3.53 g (0.015 mol) of methylmaleimidobenzoyl chloride is added to the reaction mixture. The reaction is allowed to proceed for 10 hr. After completion of the reaction, the reaction mixture is precipitated in water, and filtered under reduced pressure to isolate the polymer, which is then washed sequentially with water and ethanol, and dried under vacuum, yielding the liquid crystalline thermoset oligomer having terminal methylmaleimide groups.

Figure 3:
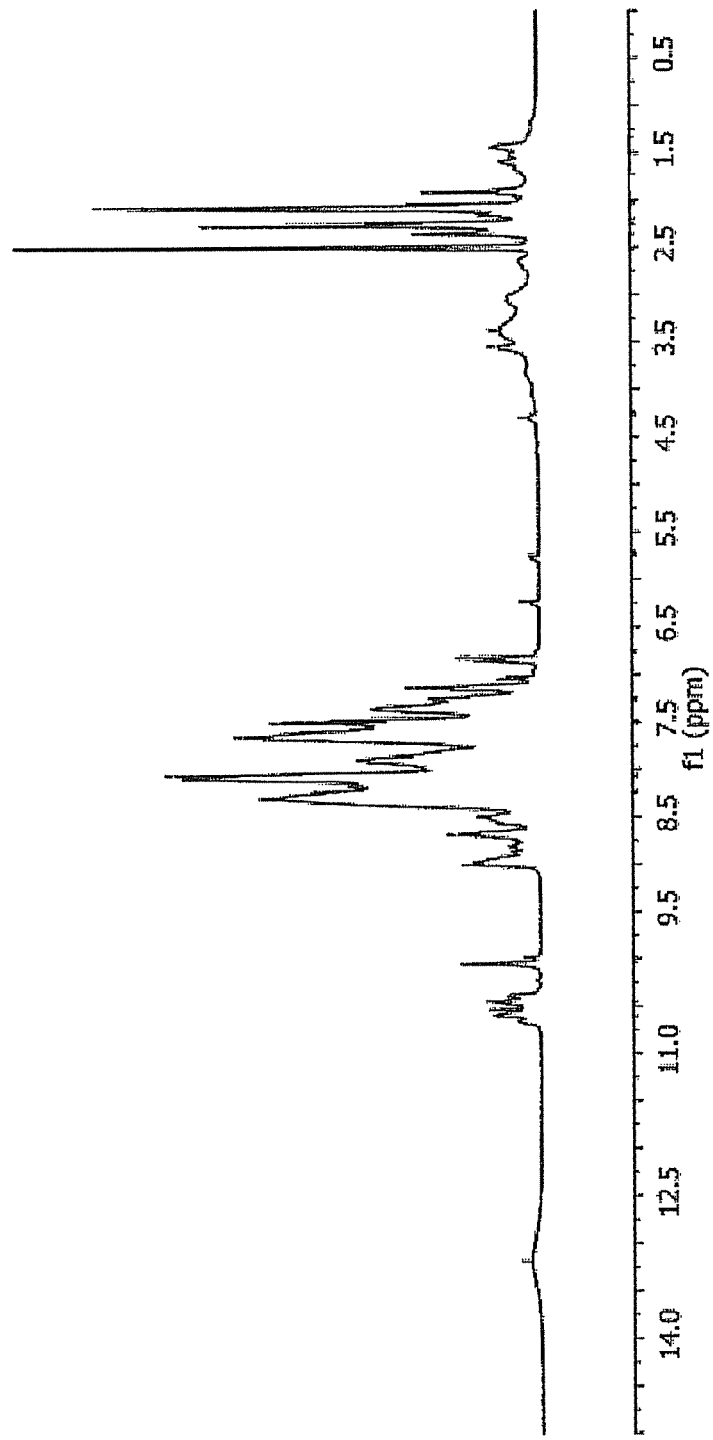
FIG. 3 is a $^1$H NMR spectrum of an exemplary liquid crystalline thermoset oligomer end-capped with methylmaleimide, which is prepared in Synthesis Example 3.

The $^1$H NMR spectrum of the liquid crystalline thermoset oligomer is shown in FIG. 3. The liquid crystalline thermoset oligomer has a number average molecular weight of 2,780, as measured by gel permeation chromatography (GPC).

Synthesis Example 4

Figure 4:
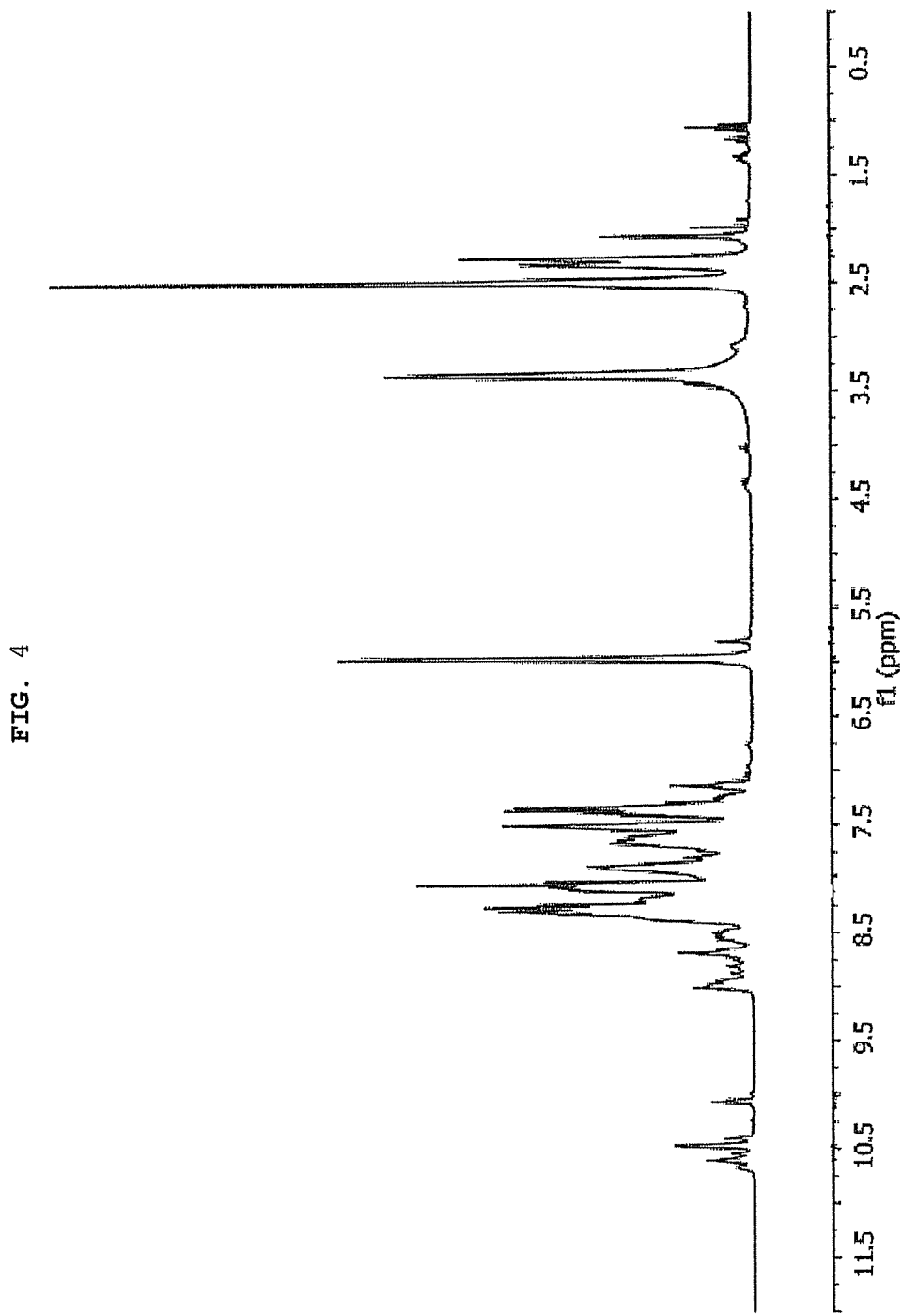
FIG. 4 is a $^1$H NMR spectrum of an exemplary liquid crystalline thermoset oligomer prepared in Synthesis Example 4.

16.613 g (0.10 mol) of isophthalic acid, 37.636 g (0.20 mol) of 6-hydroxy-2-naphthoic acid, 27.624 g (0.20 mol) of 4-hydroxy-benzoic acid, 21.826 g (0.20 mol) of 4-aminophenol and 83 ml (0.88 mol) of acetic anhydride are charged to a 500 ml flask equipped with a condenser and a mechanical stirrer. The mixture is slowly heated to 140° C. under a nitrogen atmosphere and is allowed to react (in an acetylation reaction) for 3 hr while maintaining the reaction temperature constant. After the subsequent addition of 54.254 g (0.20 mol) of tetrahydrophthalimide benzoic acid, the mixture is heated to 215° C. at a rate of 1-2° C./min while removing acetic acid as a by-product and unreacted acetic anhydride. The reaction is continued for 4 hr at this temperature, yielding a liquid crystalline thermoset oligomer having one or two nadimide reactive groups introduced into one or both ends of the backbone. The oligomer is isolated and pulverized to a finely divided powder using a pulverizer. The $^1$H NMR spectrum of the liquid crystalline thermoset oligomer is shown in FIG. 4.

Synthesis Example 5

Synthesis of Bismaleimide Compound 20.5 g of 2,2-bis[4-(4-aminophenoxy)phenyl]propane and 11 g of triethylamine are dissolved in 150 ml of DMF in a 250 ml flask. To the solution is slowly added dropwise a solution of 24 g of p-maleimidobenzoyl chloride in 50 ml of DMF to maintain room temperature. The mixture is reacted at room temperature for 16 hr. The reaction mixture is precipitated in water, and filtered under reduced pressure to isolate the product, which is then washed sequentially with water and ethanol, and dried under vacuum at 60° C. for 48 hr, yielding the bismaleimide compound of Formula 18.

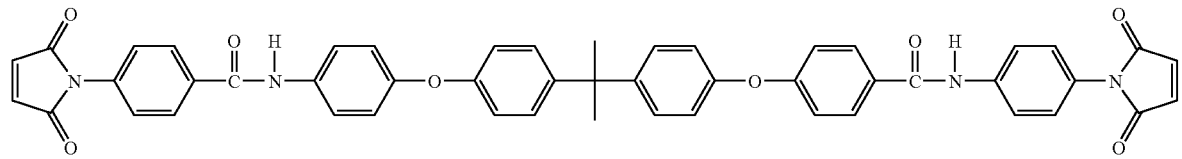

(18)

Synthesis Example 6

Synthesis of Bismaleimide Compound

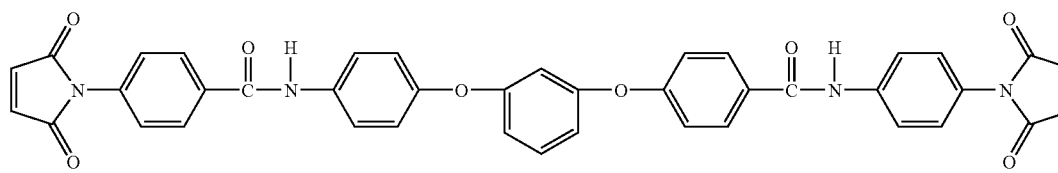

(19)

The bismaleimide compound of Formula 19 is prepared in the same manner as in Synthesis Example 4, except that 14.6 g of 1,3-bis(4-aminophenoxy)benzene is used instead of 2,2-bis[4-aminophenoxy)phenyl]propane.

Synthesis Example 7

Synthesis of Bismaleimide Compound 20.5 g (0.05 mol) of 2,2-bis[4-(4-aminophenoxy)phenyl]propane is completely dissolved in 150 ml of DMF in a 250 ml flask, and the solution is cooled to 0-5° C. To the solution is added 9.8 g of (0.1 mol) of maleic anhydride. The mixture is stirred for 2 hr. Then, 50 ml of acetic anhydride and 1 g of sodium acetate are added thereto. The resulting mixture is allowed to react at 60° C. for 4 hr. After completion of the reaction, the reaction solution is precipitated in an excess of ice-water and is filtered under vacuum. The precipitate is washed with water and dried under vacuum at 60° C. at 48 hr, yielding the bismaleimide compound of Formula 20.

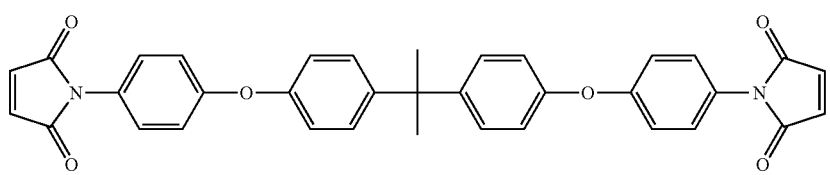

(20)

Synthesis Example 8

Synthesis of Bismaleimide Compound

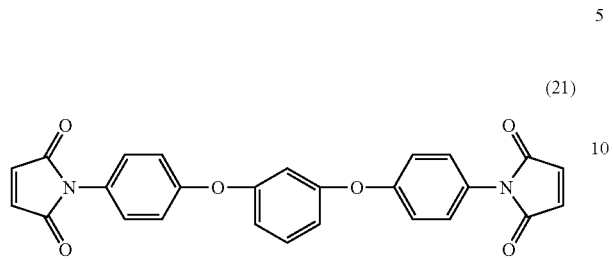

(21)

The bismaleimide compound of Formula 21 is prepared in the same manner as in Synthesis Example 6, except that 14.6 g of 1,3-bis(4-aminophenoxy)benzene is used instead of 2,2-bis[4-aminophenoxy)phenyl]propane.

Synthesis Example 9

Synthesis of Bismaleimide Compound

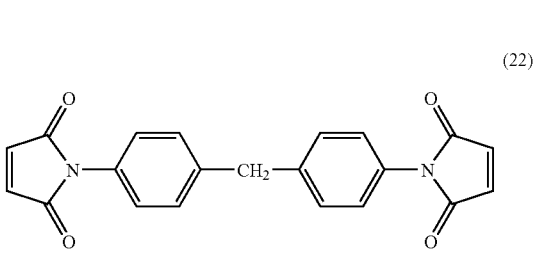 [SMILES: O=C1C=CC(=O)N1c1ccc(Cc2ccc(N3C(=O)C=CC3=O)cc2)cc1]

(22)

The bismaleimide compound of Formula 22 is prepared in the same manner as in Synthesis Example 6, except that 9.91 g of 4,4'-diaminodiphenylmethane is used instead of 2,2-bis[4-aminophenoxy)phenyl]propane.

Synthesis Example 10

Synthesis of Bisnadimide Compound

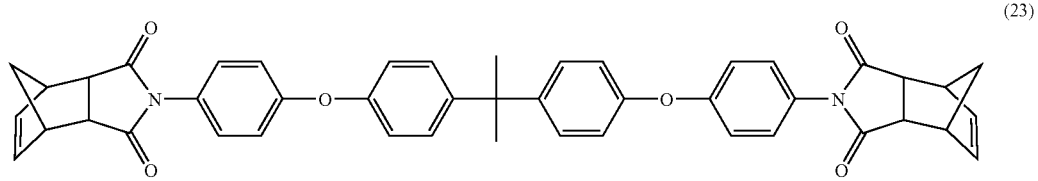 [SMILES: CC(C)(c1ccc(Oc2ccc(N3C(=O)C4C5C=CC(C5)C4C3=O)cc2)cc1)c1ccc(Oc2ccc(N3C(=O)C4C5C=CC(C5)C4C3=O)cc2)cc1]

(23)

The bisnadimide compound of Formula 23 is prepared in the same manner as in Synthesis Example 6, except that 16.42 g (0.1 mol) of 5-norbornene-2,3-dicarboxylic anhydride is used instead of 9.8 g (0.1 mol) of maleic anhydride.

Synthesis Example 11

Synthesis of Bisnadimide Compound

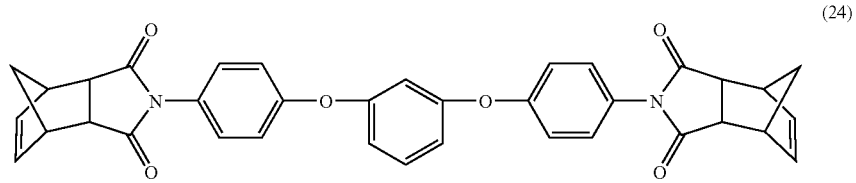 [SMILES: O=C1C2C3C=CC(C3)C2C(=O)N1c1ccc(Oc2cccc(Oc3ccc(N4C(=O)C5C6C=CC(C6)C5C4=O)cc3)c2)cc1]

(24)

The bisnadimide compound of Formula 24 is prepared in the same manner as in Synthesis Example 6, except that 14.6 g of 1,3-bis(4-aminophenoxy)benzene is used instead of 2,2-bis[4-aminophenoxy)phenyl]propane.

Example 1

2 g of the liquid crystalline thermoset oligomer end-capped with nadimide, which is prepared in Synthesis Example 1, and 2 g of the bismaleimide compound prepared in Synthesis Example 7 are dissolved in 6 g of N-methyl-2-pyrrolidone (NMP). The solution is measured to have a viscosity of about 1,100 Cps. The solution is impregnated into a glass fiber (thickness: 0.05 mm, size: 4×4 cm$^2$). The specimen is placed on an electrodeposited copper foil and is cured in an electric furnace for 1 hr while raising the temperature of the furnace from room temperature to 290° C. The cured specimen is treated with 50 parts by weight of nitric acid solution to completely remove the copper foil, leaving a prepreg only. The polymer is impregnated in an amount of 60 wt %, based on the total weight of the prepreg.

The coefficient of thermal expansion (CTE) of the prepreg is calculated using a thermomechanical analyzer (TMA 2940, TA Instruments) and is shown in Table 1. As seen in FIG. 4, the prepreg is shown to have a coefficient of thermal expansion (CTE) of 16.3 ppm/° C. in the temperature range of 50-150° C.

Example 2

Figure 5:
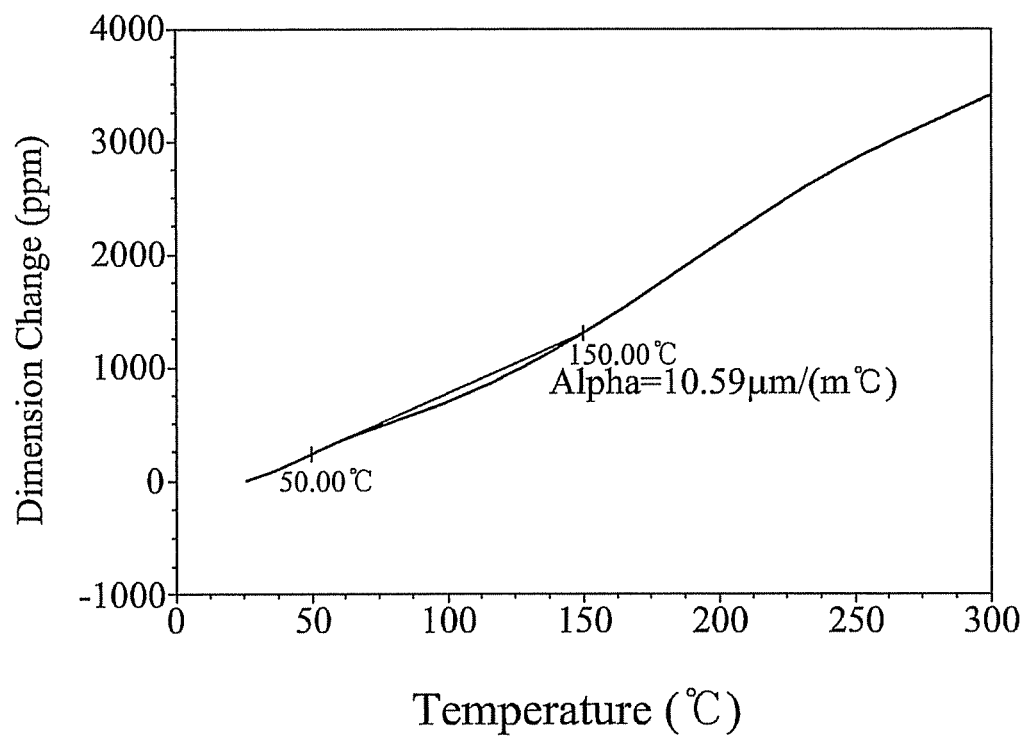
FIG. 5 is a thermomechanical analysis ("TMA") curve for an exemplary prepreg produced in Example 2.

A prepreg is produced in the same manner as in Example 1, except that 2 g of the liquid crystalline thermoset oligomer end-capped with nadimide, which is prepared in Synthesis Example 2, and 2 g of the bismaleimide compound prepared in Synthesis Example 8 are used. The coefficient of thermal expansion (CTE) of the prepreg is measured using a thermomechanical analyzer (TMA 2940, TA Instruments) and is shown in Table 1. FIG. 5 is a thermomechanical analysis (TMA) curve of the prepreg. The polymer is impregnated in an amount of 64 wt %, based on the total weight of the prepreg. As seen in FIG. 5, the prepreg is shown to have a coefficient of thermal expansion (CTE) of 10.6 ppm/° C. in the temperature range of 50-150° C.

Example 3

Figure 6:
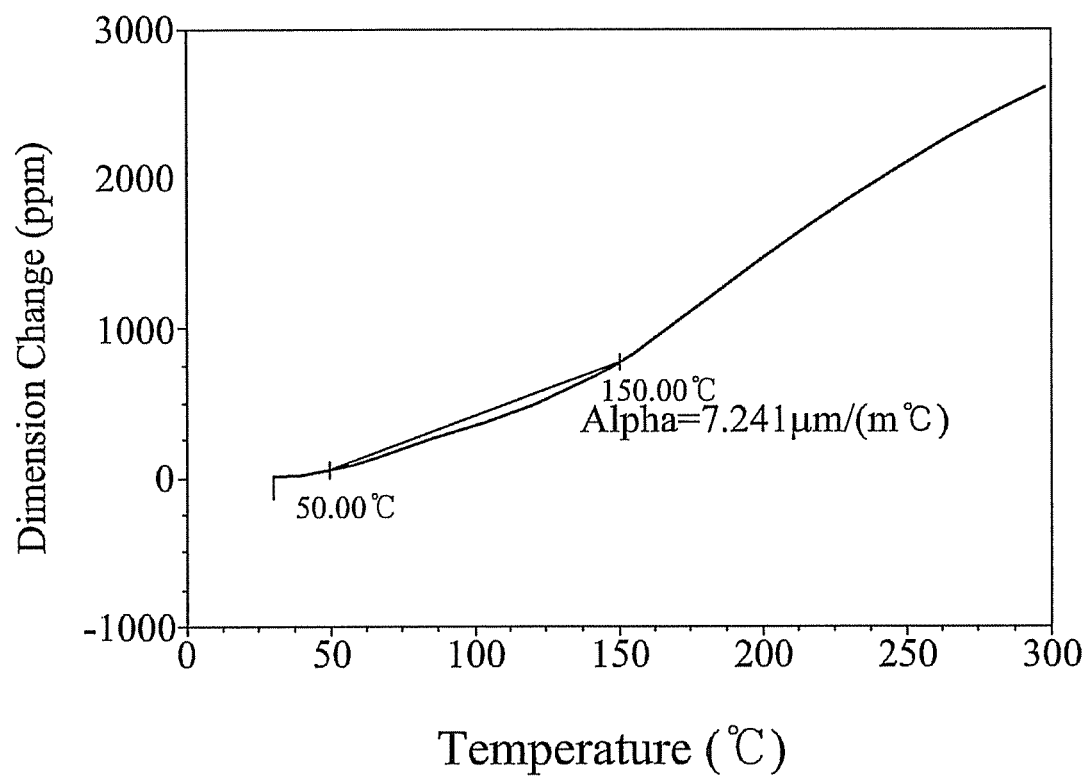
FIG. 6 is a thermomechanical analysis (TMA) curve for an exemplary prepreg produced in Example 3.

A prepreg is produced in the same manner as in Example 1, except that 2 g of the liquid crystalline thermoset oligomer end-capped with nadimide, which is prepared in Synthesis Example 2, and 2 g of the bismaleimide compound prepared in Synthesis Example 9 are used. The coefficient of thermal expansion (CTE) of the prepreg is measured using a thermomechanical analyzer (TMA 2940, TA Instruments) and is shown in Table 1. FIG. 6 is a thermomechanical analysis (TMA) curve of the prepreg. The polymer is impregnated in an amount of 50 wt %, based on the total weight of the prepreg. As seen in FIG. 6, the prepreg is shown to have a coefficient of thermal expansion (CTE) of 7.2 ppm/° C. in the temperature range of 50-150° C.

Example 4

A prepreg is produced in the same manner as in Example 1, except that 2 g of the liquid crystalline thermoset oligomer end-capped with nadimide, which is prepared in Synthesis Example 3, and 2 g of the bismaleimide compound prepared in Synthesis Example 5 are used. The results of thermomechanical analysis for the cured prepreg are shown in Table 1. The polymer is impregnated in an amount of 52 wt %, based on the total weight of the prepreg. The prepreg is found to have a coefficient of thermal expansion (CTE) of 14.5 ppm/° C. in the temperature range of 50-150° C.

Example 5

A prepreg is produced in the same manner as in Example 1, except that 2 g of the liquid crystalline thermoset oligomer end-capped with nadimide, which is prepared in Synthesis Example 3, and 2 g of the bisnadimide compound prepared in Synthesis Example 10 are used. The results of thermomechanical analysis for the cured prepreg are shown in Table 1. The polymer is impregnated in an amount of 52 wt %, based on the total weight of the prepreg. The prepreg is found to have a coefficient of thermal expansion (CTE) of 16.5 ppm/° C. in the temperature range of 50-150° C.

Example 6

A prepreg is produced in the same manner as in Example 1, except that 2 g of the liquid crystalline thermoset oligomer end-capped with nadimide, which is prepared in Synthesis Example 3, and 2 g of the bisnadimide compound prepared in Synthesis Example 11 are used. The results of thermomechanical analysis for the cured prepreg are shown in Table 1. The polymer is impregnated in an amount of 53 wt %, based on the total weight of the prepreg. The prepreg is found to have a coefficient of thermal expansion (CTE) of 14.7 ppm/° C. in the temperature range of 50-150° C.

Example 7

A prepreg is produced in the same manner as in Example 1, except that 2 g of the liquid crystalline thermoset oligomer end-capped with nadimide, which is prepared in Synthesis Example 2, and 2 g of the bismaleimide compound prepared in Synthesis Example 6 are used. The results of thermomechanical analysis for the cured prepreg are shown in Table 1. The polymer is impregnated in an amount of 60 wt %, based on the total weight of the prepreg. The prepreg is found to have a coefficient of thermal expansion (CTE) of 14.6 ppm/° C. in the temperature range of 50-150° C.

Example 8

A prepreg is produced in the same manner as in Example 1, except that 2 g of the liquid crystalline thermoset oligomer end-capped with nadimide, which is prepared in Synthesis Example 2, 1.2 g of the bismaleimide compound prepared in Synthesis Example 8 and 0.8 g of the bismaleimide compound prepared in Synthesis Example 9 are used. The results of thermomechanical analysis for the cured prepreg are shown in Table 1. The polymer is impregnated in an amount of 52 wt %, based on the total weight of the prepreg. The prepreg is found to have a coefficient of thermal expansion (CTE) of 10.2 ppm/° C. in the temperature range of 50-150° C.

Example 9

Figure 7:
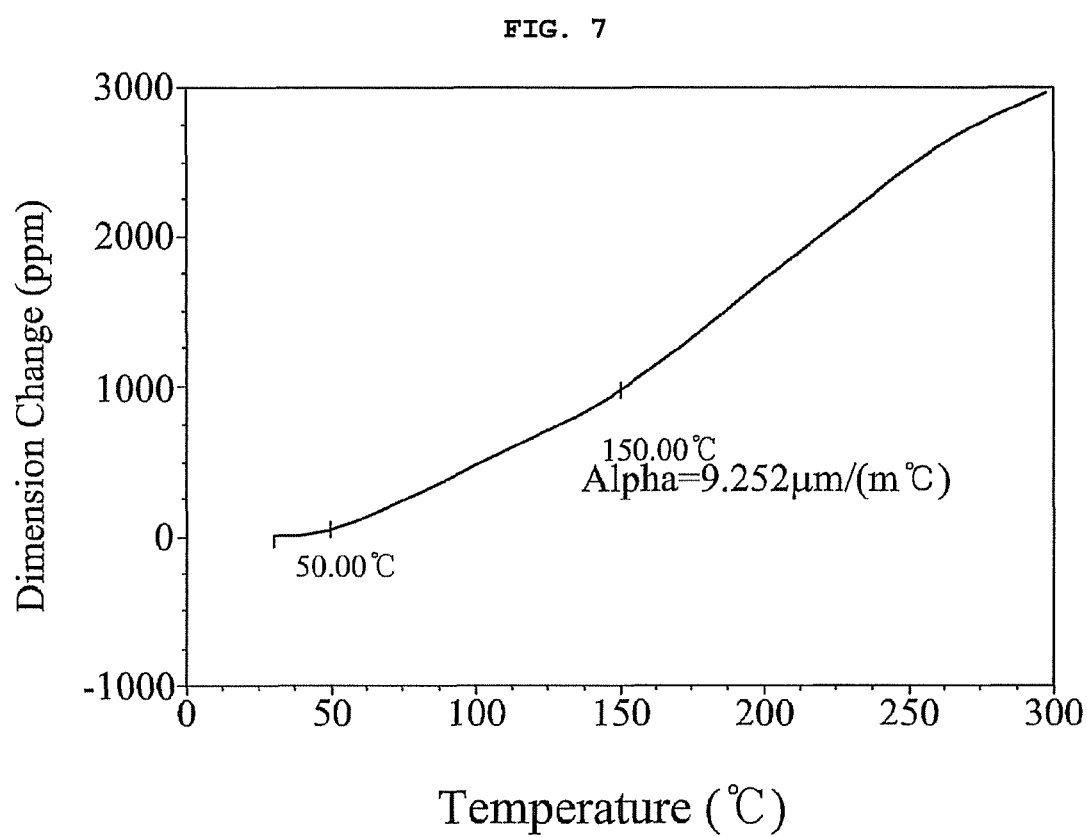
FIG. 7 is a thermomechanical analysis (TMA) curve for an exemplary prepreg produced in Example 9.

A prepreg is produced in the same manner as in Example 1, except that 2.8 g of the liquid crystalline thermoset oligomer end-capped with nadimide, which is prepared in Synthesis Example 2, and 1.2 g of the bismaleimide compound prepared in Synthesis Example 9 are used. The results of thermomechanical analysis for the cured prepreg are shown in Table 1. FIG. 7 is a thermomechanical analysis (TMA) curve of the prepreg. The polymer is impregnated in an amount of 59 wt %, based on the total weight of the prepreg. The prepreg is found to have a coefficient of thermal expansion (CTE) of 9.3 ppm/° C. in the temperature range of 50-150° C.

Example 10

A prepreg is produced in the same manner as in Example 1, except that 2.8 g of the liquid crystalline thermoset oligomer end-capped with nadimide, which is prepared in Synthesis Example 2, 0.6 g of the bismaleimide compound prepared in Synthesis Example 7, and 0.6 g of the bismaleimide compound prepared in Synthesis Example 9 are used. The results of thermomechanical analysis for the cured prepreg are shown in Table 1. The polymer is impregnated in an amount of 58 wt %, based on the total weight of the prepreg. The prepreg is found to have a coefficient of thermal expansion (CTE) of 13.6 ppm/° C. in the temperature range of 50-150° C.

Example 11

A prepreg is produced in the same manner as in Example 1, except that 2.8 g of the liquid crystalline thermoset oligomer end-capped with nadimide, which is prepared in Synthesis Example 4, and 1.2 g of the bismaleimide compound prepared in Synthesis Example 8 are used. The results of thermomechanical analysis for the cured prepreg are shown in Table 1. The polymer is impregnated in an amount of 52 wt %, based on the total weight of the prepreg. The prepreg is found to have a coefficient of thermal expansion (CTE) of 11.0 ppm/° C. in the temperature range of 50-150° C.

TABLE 1

| Example No. | LCT oligomer | Crosslinking agent | Amount of resin impregnated (wt %) | CTE (ppm/° C.) | Dielectric constant |
|---|---|---|---|---|---|
| 1 | Synthesis Example 1 | Synthesis Example 7 | 60 | 16.3 | 3.4 |
| 2 | Synthesis Example 2 | Synthesis Example 8 | 64 | 10.6 | 3.4 |
| 3 | Synthesis Example 2 | Synthesis Example 9 | 50 | 7.2 | 3.6 |
| 4 | Synthesis Example 3 | Synthesis Example 5 | 52 | 14.5 | 3.6 |
| 5 | Synthesis Example 3 | Synthesis Example 10 | 52 | 16.5 | 3.5 |
| 6 | Synthesis Example 3 | Synthesis Example 11 | 53 | 14.7 | 3.5 |
| 7 | Synthesis Example 2 | Synthesis Example 6 | 60 | 14.6 | 3.7 |
| 8 | Synthesis Example 2 | Synthesis Examples 8, 9 | 52 | 10.2 | 3.5 |
| 9 | Synthesis Example 2 | Synthesis Example 9 | 59 | 9.3 | 3.5 |
| 10 | Synthesis Example 2 | Synthesis Examples 7, 9 | 58 | 13.6 | 3.6 |
| 11 | Synthesis Example 4 | Synthesis Example 8 | 52 | 11.0 | 3.7 |

Evaluation of Physical Properties

In each of the prepregs produced in Examples 1-11, the amount (wt %) of the resin impregnated implies the sum of the amount of the resin penetrating and attached to the reinforcing material and the amount of the resin layered on the surface of the reinforcing material, based on the total weight amount of the prepreg.

After the three same prepregs are laminated under pressure in a press at 290° C. for 1 hr until the total thickness of the prepregs reaches 300 μm or more, the dielectric constant of the laminate is measured using a radio frequency ("RF") impedance analyzer (E4991A, Agilent) at 1 GHz.

The coefficients of thermal expansion (CTE) of the prepregs produced in Examples 1-11 are measured using a thermomechanical analyzer (TMA 2940, TA Instruments). The CTE measurements are performed under a nitrogen atmosphere while raising the temperature at a rate of 5° C./min.

The viscosities of the solutions prepared in Examples 1-11 are measured using a Brookfield viscometer (Model no. LVDVII+).

Example 12

2.4 g of the liquid crystalline thermoset (LCT) oligomer end-capped with nadimide, which is prepared in Synthesis Example 1, 0.8 g of the bismaleimide compound prepared in Synthesis Example 8 and 0.8 g of the epoxy compound of Formula 25 are dissolved in 6 g of NMP. To the solution is added 0.012 g (0.01% relative to the total amount of the solutes) of the catalyst of Formula 26. The mixture is homogenized with sufficient stirring. A prepreg is produced using the solution by the same method described in Example 1.

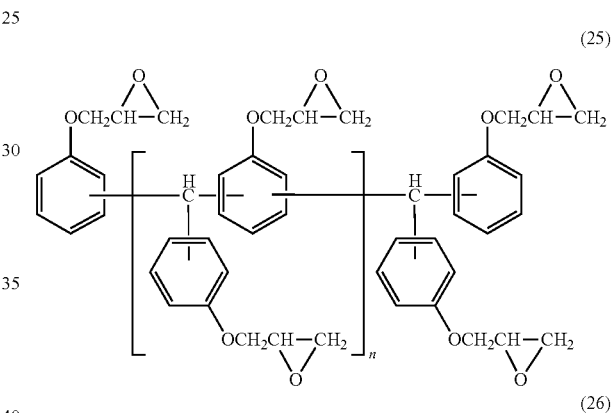

(25)

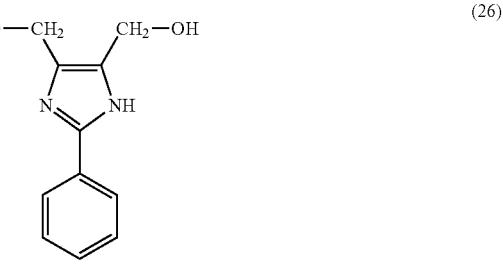

(26)

The 180° peel test is conducted on the prepreg using a universal testing machine ("UTM"). The prepreg is measured to have an adhesive strength of 0.75 kiloNewtons per meter (kN/m). The coefficient of thermal expansion (CTE) of the prepreg is measured using thermomechanical analyzer (TMA 2940, TA Instruments) in the temperature range of 50-150° C. The TMA results show that a specimen of the prepreg having an impregnation rate of 60 wt % has a CTE of 16.1 ppm/° C. in the temperature range of 50-150° C.

Although exemplary embodiments have been described herein with reference to the foregoing preferred embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:

1. A thermosetting composition comprising:
   an organic solvent;
   a liquid crystalline thermoset oligomer; and
   a crosslinking agent having crosslinkable reactive groups at both ends thereof; and
   optionally an epoxy compound;
   wherein the liquid crystalline thermoset oligomer is represented by Formula 1:

$$Z^1 \mkern-4mu - \mkern-4mu [R^1]_n \mkern-4mu - \mkern-4mu [R^2]_m \mkern-4mu - \mkern-4mu Z^2 \qquad (1)$$

wherein $R^1$ is represented by Formula 2:

$$-X^1-Ar^1-Y^1- \qquad (2)$$

wherein $X^1$ and $Y^1$ are each independently selected from the group consisting of —O—, —C(O)—, —NR″, and any combination thereof, wherein R″ is selected from the group consisting of a hydrogen atom, substituted or unsubstituted $C_1$-$C_{20}$ alkyl groups, substituted or unsubstituted $C_6$-$C_{30}$ aryl groups, and any combination thereof, and $Ar^1$ contains at least one divalent aromatic or alicyclic organic group selected from the group consisting of:

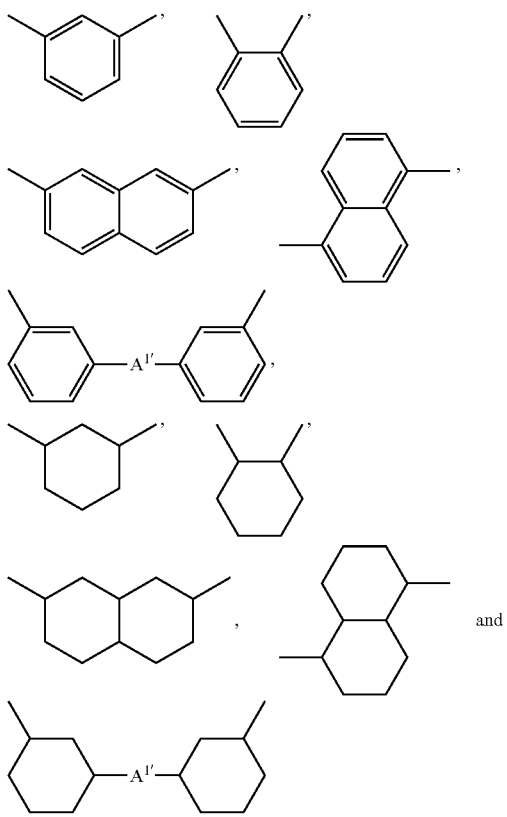

and any combination thereof, wherein at least one of the carbon atoms present in each of the aromatic and alicyclic rings is optionally replaced by a heteroatom selected from the group consisting of N, O, S, P, and any combination thereof, and $A^{1'}$ represents a single bond or is —O—, —S—, —C(O)—, —S(O)—, —S(O)$_2$—, a divalent aliphatic or aromatic organic group, or any combination thereof;

$R^2$ is represented by Formula 6:

$$X^2-Ar^3-Y^2 \qquad (6)$$

wherein $X^2$ and $Y^2$ are each independently selected from the group consisting of —O—, —C(O)—, —NR″, and any combination thereof, wherein R″ is selected from the group consisting of a hydrogen atom, substituted or unsubstituted $C_1$-$C_{20}$ alkyl groups, substituted or unsubstituted $C_6$-$C_{30}$ aryl groups, and any combination thereof, and $Ar^3$ contains at least one divalent aromatic selected from the group consisting of:

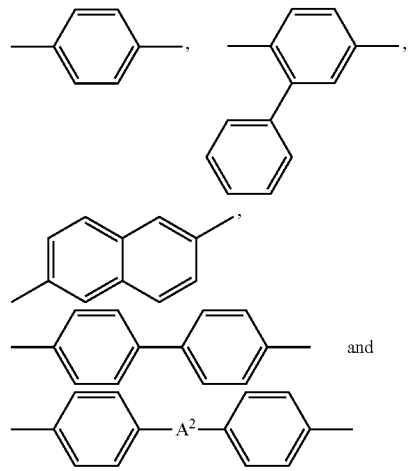

and any combination thereof, wherein the aromatic rings contain only carbon atoms, or wherein at least one of the carbon atoms present in each of the aromatic rings is replaced by a heteroatom selected from the group consisting of N, O, S, P, and any combination thereof, and $A^2$ represents a single bond or is —N$_2$—, —O—, —S—, —C(O)—, —S(O)—, —S(O)$_2$—, a divalent aliphatic or aromatic organic group, and any combination thereof;

$Z^1$ and $Z^2$ are each independently a thermally crosslinkable reactive group having a terminal multiple bond, and
   m and n are each independently an integer from about 1 to about 50.

2. The thermosetting composition of claim 1, wherein $R^1$ is a divalent aromatic or alicyclic structural unit having two linking groups located in a 1,2 or 1,3 position relative to each other.

3. The thermosetting composition of claim 1, wherein the divalent aliphatic or aromatic organic group of $A^1$ in Formula 3 is selected from the group consisting of:
   substituted or unsubstituted $C_2$-$C_{20}$ alkylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a linking group represented by Formula 3a:

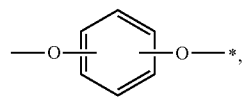  (3a)

a linking group represented by Formula 3b:

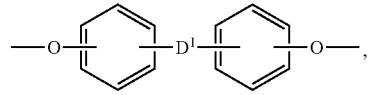  (3b)

and any combination thereof, wherein $D^1$ is selected from —O—, —S—, —C(O)—, —S(O)—, —S(O)$_2$—, linear or branched $C_2$-$C_{20}$ alkylene groups, and any combination thereof.

4. The thermosetting composition of claim 3, wherein the aromatic rings of Formulas 3a and 3b contain CH moieties and the aromatic rings contain only carbon atoms, or wherein at least one of the CH moieties present in the aromatic rings of Formulas 3a and 3b is replaced by a heteroatom selected from the group consisting of N, O, S, P, and any combination thereof.

5. The thermosetting composition of claim 1, wherein the divalent aliphatic or aromatic organic group of $A^2$ in Formula 7 is selected from the group consisting of substituted or unsubstituted $C_2$-$C_{20}$ alkylene groups, substituted or unsubstituted $C_2$-$C_{20}$ alkenylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a group represented by Formula 8a, a group of Formula 8b:

(8a)

wherein $R_a$ is a hydrogen atom, a halogen atom, a $C_1$-$C_5$ alkyl group or a $C_1$-$C_5$ haloalkyl group,

(8b)

wherein $R_a$ and $R_b$ are each independently a hydrogen atom, a halogen atom, a $C_1$-$C_5$ alkyl group or a $C_1$-$C_5$ haloalkyl group, and any combination thereof.

6. The thermosetting composition of claim 1, wherein $Z^1$ and $Z^2$ in Formula 1 are each independently selected from the group consisting of maleimide, nadimide, citraconimide, phthalimide, acetylene, propargyl ether, benzocyclobutene, cyanate and any combination thereof.

7. The thermosetting composition of claim 1, wherein n/(n+m+2) in Formula 1 is greater than 0.05 and less than or equal to 0.6.

8. The thermosetting composition of claim 1, wherein the liquid crystalline thermoset oligomer has a structure of Formula 12a or 12b:

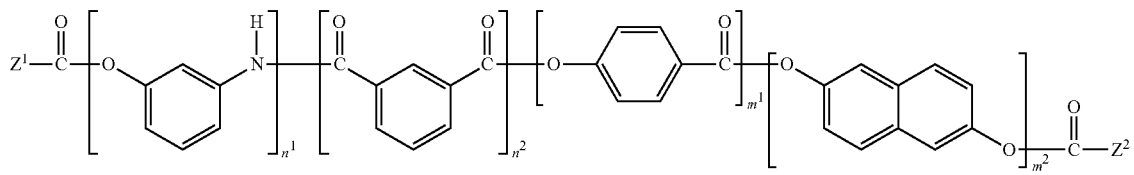

(12a)

wherein $Z^1$ and $Z^2$ are each independently selected from the group consisting of maleimide, nadimide, phthalimide, acetylene, citraconimide, propargyl ether, benzocyclobutene, cyanate, and any combination thereof, and $m^1$, $m^2$, $n^1$ and $n^2$ are each independently a positive integer from 1 to 50, wherein $1 \le m^1+m^2 \le 50$ and $1 \le n^1+n^2 \le 50$;

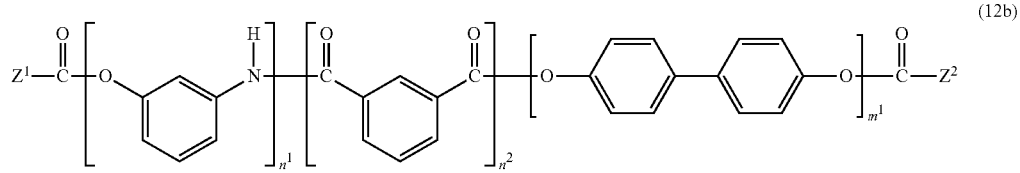

(12b)

wherein $Z^1$ and $Z^2$ are each independently selected from the group consisting of maleimide, nadimide, citraconimide, phthalimide, acetylene, propargyl ether, benzocyclobutene, cyanate, and any combination thereof; and wherein $m^1$, $n^1$ and $n^2$ are each independently a positive integer from 1 to 50, wherein $1 \le m^1 \le 50$ and $1 \le n^1+n^2 \le 50$.

9. The thermosetting composition of claim 1, wherein the liquid crystalline thermoset oligomer is a structure of Formulae 13a to 13k:

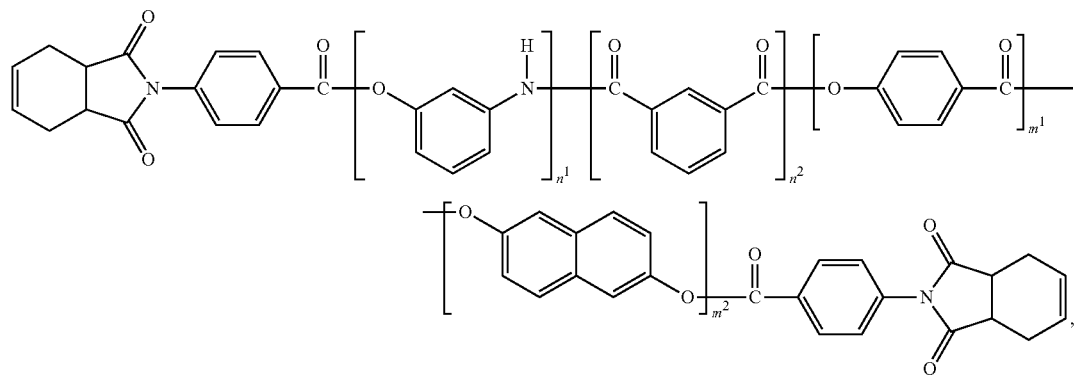
(13a)
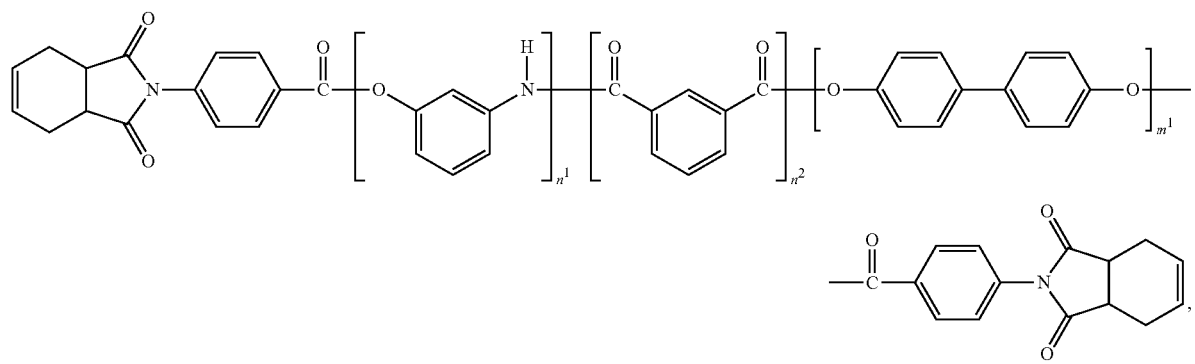
(13b)
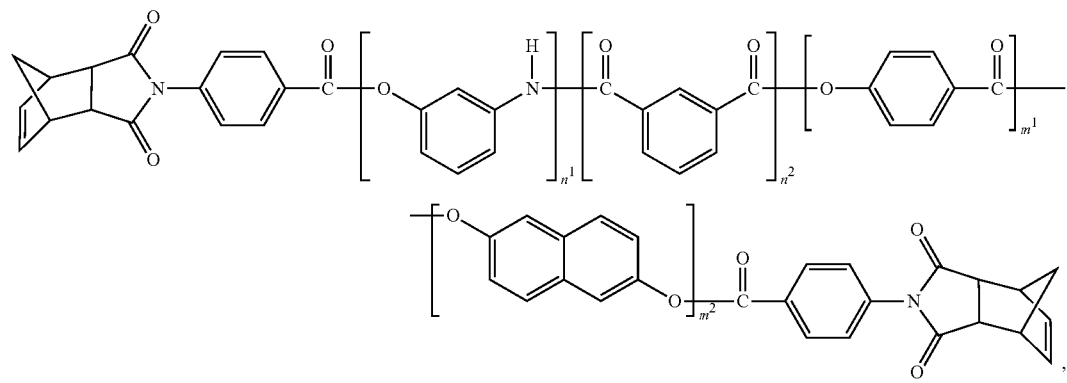
(13c)
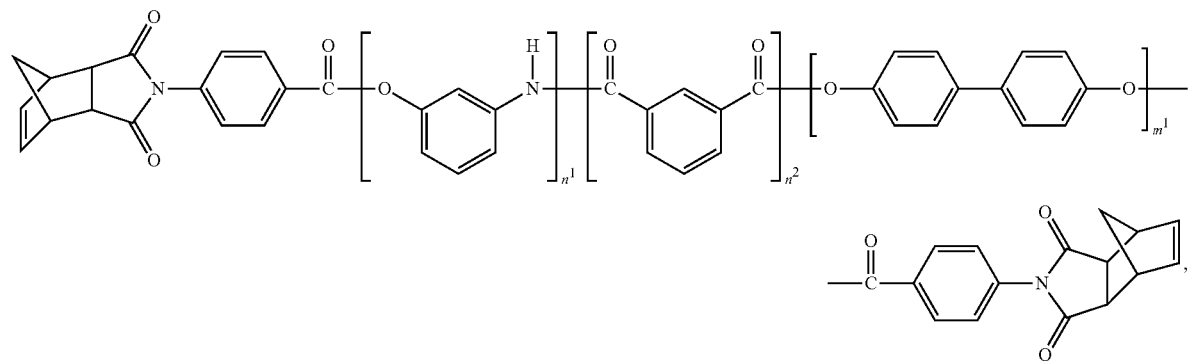
(13d)

-continued
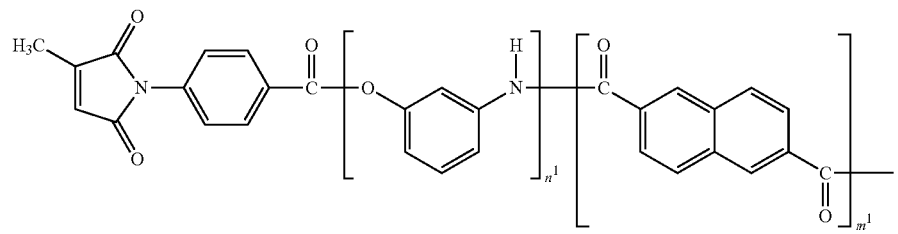
(13e)
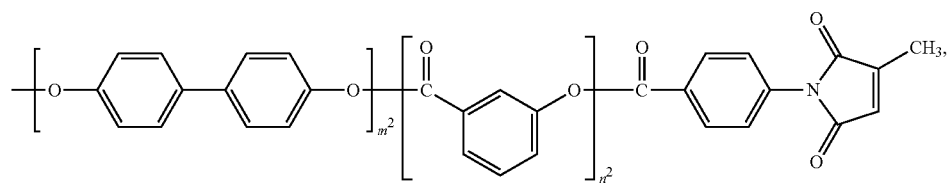
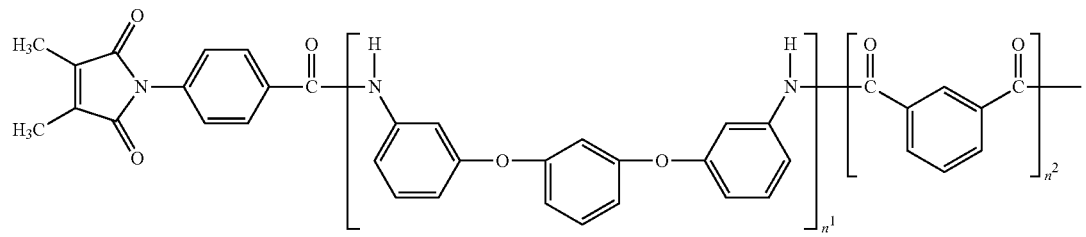
(13f)
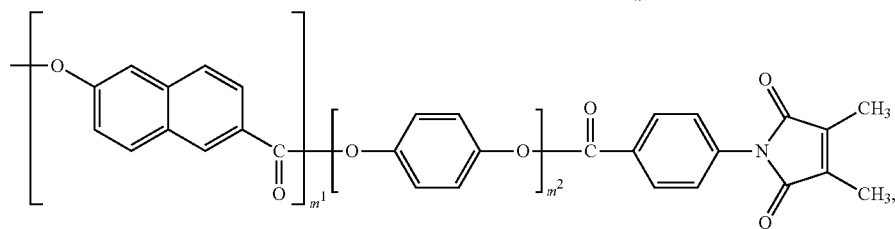
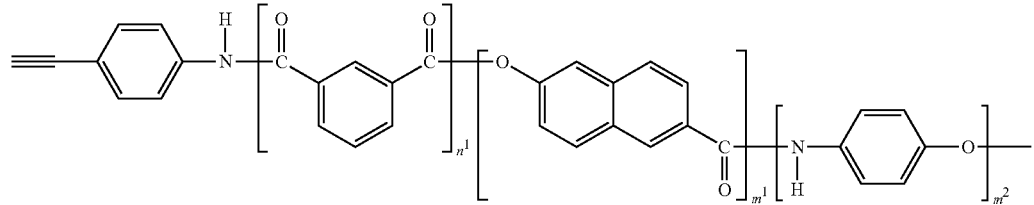
(13g)
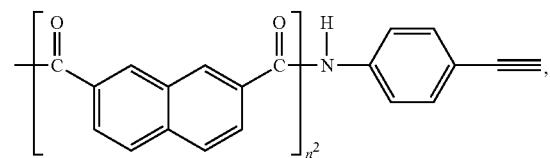
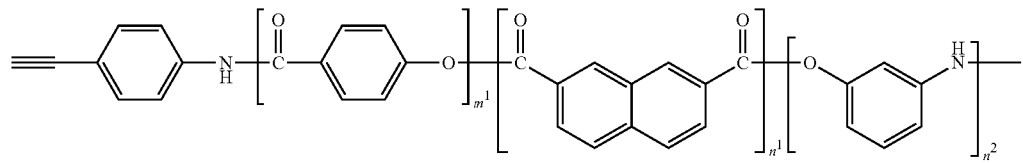
(13h)
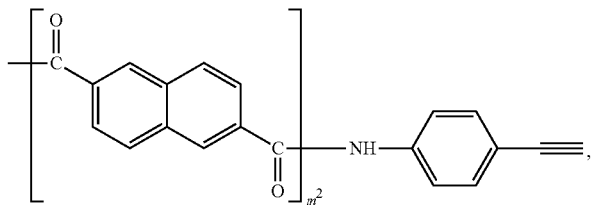

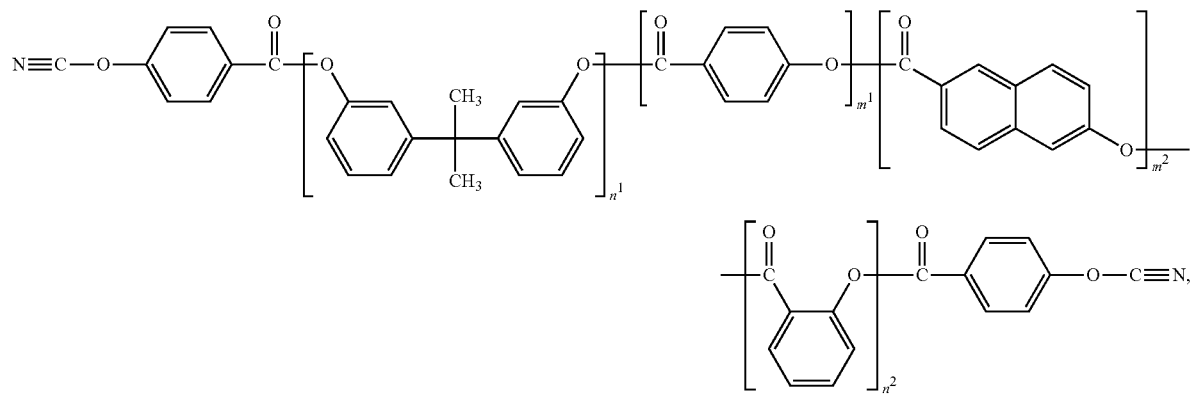
(13i)
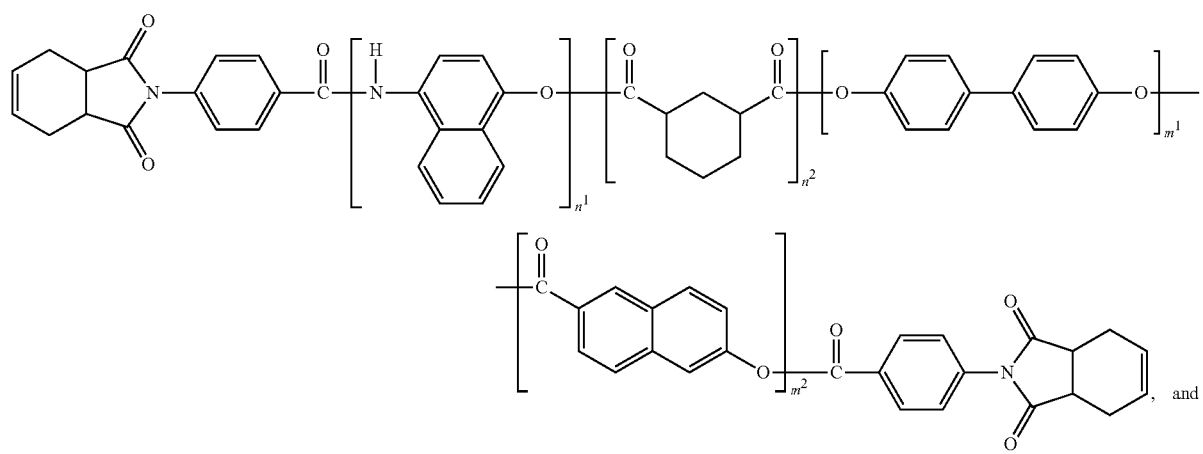
(13j)
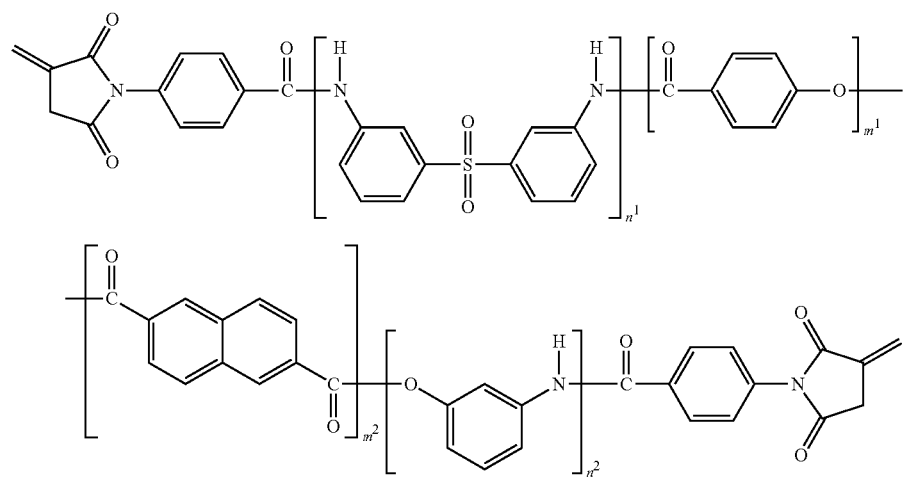
(13k)

wherein $m^1$, $m^2$, $n^1$ and $n^2$ are each independently a positive integer from 1 to 50.

10. The thermosetting composition of claim 1, wherein the liquid crystalline thermoset oligomer has a number average molecular weight of about 500 to about 9,000.

11. The thermosetting composition of claim 1, wherein the crosslinking agent has a molecular weight of about 200 to about 900 and is represented by Formula 14:

$$Z^3\text{-}A^3\text{-}Z^4 \quad (14)$$

wherein $Z^3$ and $Z^4$ are each independently selected from the group consisting of:

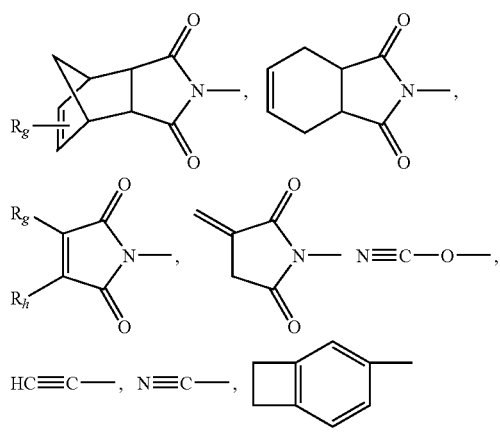

and any combination thereof, wherein $R_g$ and $R_h$ are each independently a proton, a $C_1$-$C_6$ alkyl group, a halogen, or any combination thereof, and $A^3$ is a structural unit represented by Formula 15:

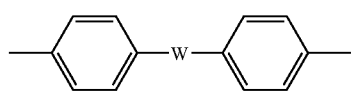

(15)

wherein W is selected from the group consisting of —O—, —S—, —C(O)—, —S(O)—, —S(O)$_2$—, substituted or unsubstituted $C_2$-$C_{20}$ alkylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a linking group represented by Formula 16a:

$$\text{—}B_1\text{—}Ar^5\text{—}B_2\text{—} \quad (16a)$$

and any combination thereof, wherein $B_1$ and $B_2$ are each independently selected from the group consisting of —O—, —S—, —C(O)—, —S(O)—, —S(O)$_2$—, —C(O)NH—, —C(O)O—, and any combination thereof, and $Ar^5$ is a divalent group comprising an aromatic group.

12. The thermosetting composition of claim 11, wherein $Ar^5$ in Formula 16a is selected from the group consisting of:

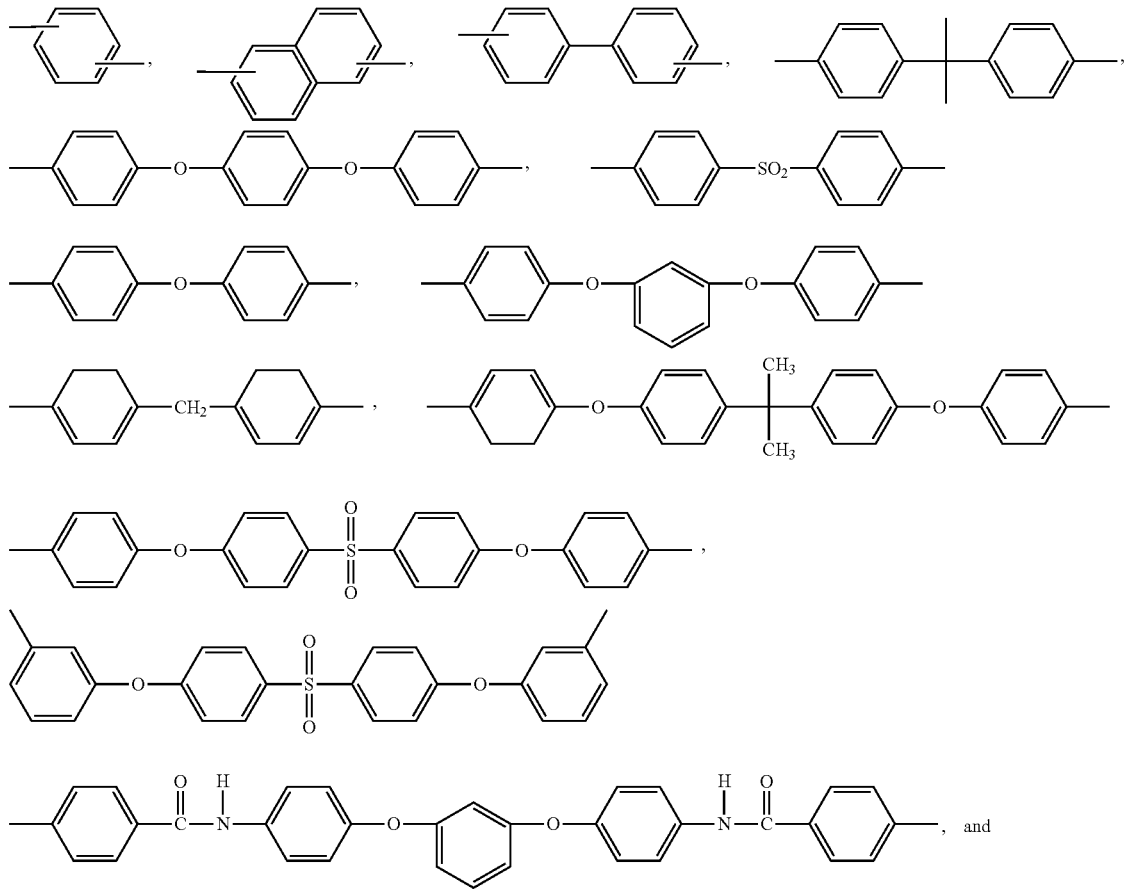

-continued

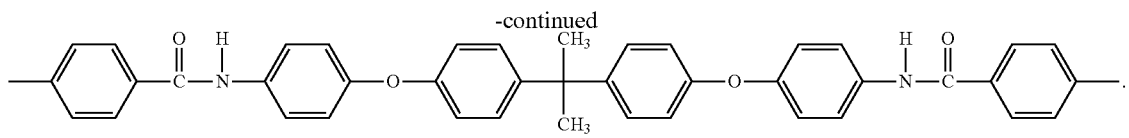

13. The thermosetting composition of claim 1, wherein the thermosetting composition comprises about 5 to about 200 parts by weight of the liquid crystalline thermoset oligomer and about 5 to about 80 parts by weight of the crosslinking agent, based on 100 parts by weight of the organic solvent.

14. The thermosetting composition of claim 1, wherein the liquid crystalline thermoset oligomer is mixed with the crosslinking agent in a weight ratio of about 1:9 to about 9:1.

15. The thermosetting composition of claim 1, wherein the organic solvent is a polar aprotic solvent.

16. The thermosetting composition of claim 1, further comprising a liquid crystal polymer or oligomer having one or two hydroxyl groups at one or both ends of a backbone, wherein the liquid crystal polymer or oligomer has a backbone selected from the group consisting of aromatic polyester, aromatic polyester amide, aromatic polyamide, and any combination thereof.

17. The thermosetting composition of claim 1, further comprising a liquid crystal polymer having a number average molecular weight of about 10,000 to about 500,000.

18. The thermosetting composition of claim 17, wherein the liquid crystal polymer has a backbone containing aromatic polyester, aromatic polyester amide, aromatic polyamide, or any combination thereof.

19. A cured resin product comprising a cure product of
a crosslinking agent having crosslinkable reactive groups at both ends thereof; an optionally an epoxy compound; and
a liquid crystalline thermoset oligomer of Formula 1:

$$Z^1\!-\!\!\left[\!-\!R^1\!-\!\right]_n\!\!-\!\!\left[\!-\!R^2\!-\!\right]_m\!\!Z^2 \quad (1)$$

wherein $R^1$ is represented by Formula 2:

$$-\!X^1\!-\!Ar^1\!-\!Y^1\!- \quad (2)$$

wherein $X^1$ and $Y^1$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, and substituted or unsubstituted $C_6$-$C_{30}$ aryl groups, and any combination thereof, and $Ar^1$ contains at least one divalent aromatic or alicyclic organic group selected from the group consisting of:

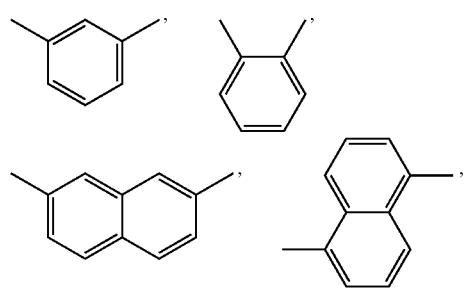

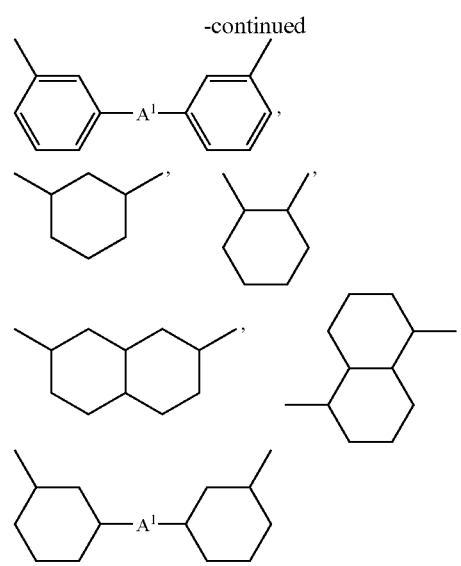

and any combination thereof, wherein the aromatic and alicyclic rings contain only carbon atoms, or wherein at least one carbon atom present in each of the aromatic and alicyclic rings is replaced by a heteroatom selected from the group consisting of N, O, S, P, and any combination thereof, and $A^1$ represents a single bond or is —O—, —S—, —C(O)—, —S(O)—, —S(O)$_2$—, a divalent aliphatic or aromatic organic group, and any combination thereof, $R^2$ is represented by Formula 6:

$$-\!X^2\!-\!Ar^3\!-\!Y^2\!- \quad (6)$$

wherein $X^2$ and $Y^2$ are each independently selected from the group consisting of —O—, —C(O)—, —NR"—, and any combination thereof, wherein R" is selected from the group consisting of a hydrogen atom, substituted or unsubstituted $C_1$-$C_{20}$ alkyl groups, and substituted or unsubstituted $C_6$-$C_{30}$ aryl groups, and any combination thereof, and $Ar^3$ contains at least one divalent aromatic group selected from the group consisting of:

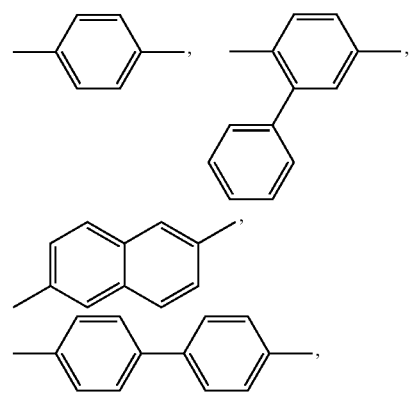

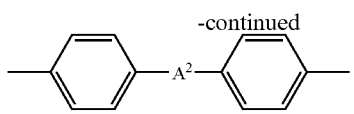

and any combination thereof, wherein the aromatic and alicyclic rings contain only carbon atoms, or wherein at least one of the carbon atoms present in each of the aromatic rings is replaced by a heteroatom selected from the group consisting of N, O, S, P, and any combination thereof, and $A^2$ represents a single bond or is —$N_2$—, —O—, —S—, —C(O)—, —S(O)—, —S(O)$_2$—, a divalent aliphatic or aromatic organic group, and any combination thereof, $Z^1$ and $Z^2$ are each independently a thermally crosslinkable reactive group having a terminal multiple bond, and m and n are each independently an integer from about 1 to about 50.

20. The cured resin product of claim 19, wherein the crosslinking agent is represented by Formula 14:

wherein $Z^3$ and $Z^4$ are each independently a crosslinkable monovalent organic group, and $A^3$ is a linking group represented by Formula 15:

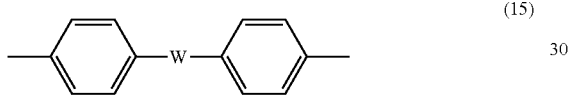

wherein W is selected from the group consisting of —O—, —S—, —C(O)—, —S(O)—, —S(O)$_2$—, substituted or unsubstituted $C_2$-$C_{20}$ alkylene groups, substituted or unsubstituted $C_2$-$C_{20}$ alkoxylene groups, substituted or unsubstituted $C_2$-$C_{20}$ oxyalkoxylene groups, substituted or unsubstituted $C_6$-$C_{30}$ arylene groups, substituted or unsubstituted $C_6$-$C_{30}$ oxyarylene groups, substituted or unsubstituted $C_4$-$C_{30}$ heteroarylene groups, substituted or unsubstituted $C_4$-$C_{30}$ oxyheteroarylene groups, a linking group represented by Formula 16a:

and any combination thereof, wherein $B_1$ and $B_2$ are each independently selected from the group consisting of —O—, —S—, —C(O)—, —S(O)—, —S(O)$_2$—, —C(O)NH—, —C(O)O—, and any combination thereof, and $Ar^5$ is a divalent group comprising an aromatic group.

21. The cured resin product of claim 19, wherein the cured resin product is in the form of a sheet.

22. A board comprising the cured resin product of claim 19.

23. The board of claim 22, further comprising a reinforcing material wherein the cured resin product penetrates and is attached to the reinforcing material or is positioned on the surface of the reinforcing material.

24. The board of claim 23, wherein the board has a coefficient of thermal expansion not higher than 20 ppm/° C.

25. The board of claim 23, wherein the board has a coefficient of thermal expansion of 15 ppm/° C.

26. The board of claim 23, wherein the reinforcing material is selected from the group consisting of woven glass cloth, woven alumina glass fibers, glass fiber non-woven fabrics, cellulose non-woven fabrics, woven carbon fibers, polymer fabrics, and any combination thereof.

27. The board of claim 22, further comprising a metal foil bound to at least one side of the cured resin product.

28. The board of claim 27, wherein the metal foil is patterned on one or both sides thereof.

29. A storage medium comprising the board of claim 22 and one or more memory chips electrically connected to the board.

30. A prepreg, comprising a cured resin product of:
a liquid crystalline thermoset oligomer, and
a crosslinking agent having crosslinkable reactive groups at both ends thereof; an optionally an epoxy compound; and wherein the liquid crystalline thermoset oligomer is represented by Formula 1:

wherein $R^1$ is represented by Formula 2:

wherein $X^1$ and $Y^1$ are each independently selected from the group consisting of —O—, —C(O)—, —NR", and any combination thereof, wherein R" is selected from the group consisting of a hydrogen atom, substituted or unsubstituted $C_1$-$C_{20}$ alkyl groups, substituted or unsubstituted $C_6$-$C_{30}$ aryl groups, and any combination thereof, and $Ar^1$ contains at least one divalent aromatic or alicyclic organic group selected from the group consisting of:

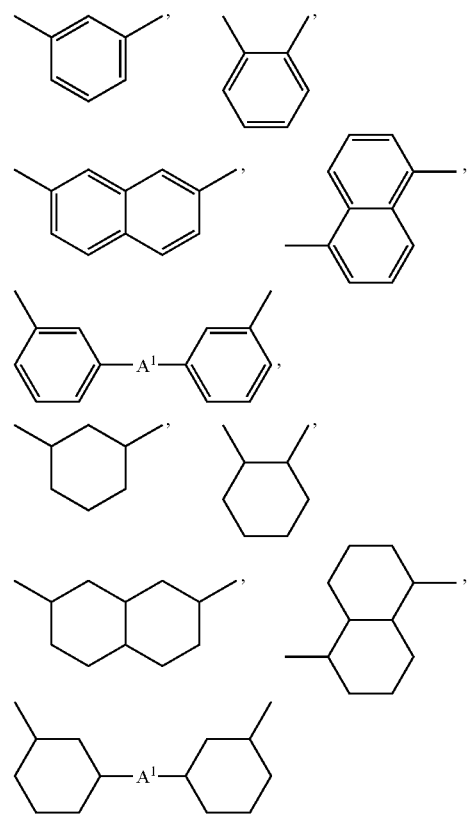

and any combination thereof, wherein at least one of the carbon atoms present in each of the aromatic and alicyclic rings is optionally replaced by a heteroatom selected from the group consisting of N, O, S, P, and any combination thereof, and $A^1$ represents a single bond or is —O—, —S—, —C(O)—, —S(O)—, —S(O)$_2$—, a divalent aliphatic or aromatic organic group, or any combination thereof, R$^2$ is represented by Formula 6:

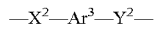  (6)

wherein X$^2$ and Y$^2$ are each independently selected from the group consisting of —O—, —C(O)—, —NR″, and any combination thereof, wherein R″ is selected from the group consisting of a hydrogen atom, substituted or unsubstituted C$_1$-C$_{20}$ alkyl groups, substituted or unsubstituted C$_6$-C$_{30}$ aryl groups, and any combination thereof, and Ar$^3$ contains at least one divalent aromatic group selected from the group consisting of:

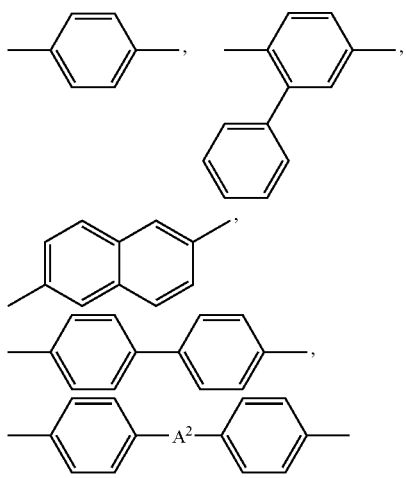

and any combination thereof, wherein the aromatic and alicyclic rings contain only carbon atoms, or wherein at least one of the carbon atoms present in each of the aromatic rings is replaced by a heteroatom selected from the group consisting of N, O, S, P, and any combination thereof, and A$^2$ represents a single bond or is —N$_2$—, —O—, —S—, —C(O)—, —S(O)—, —S(O)$_2$—, a divalent aliphatic or aromatic organic group, and any combination thereof, Z$^1$ and Z$^2$ are each independently a thermally crosslinkable reactive group having a terminal multiple bond, and m and n are each independently an integer from about 1 to about 50; and a reinforcing material selected from the group consisting of woven glass cloth, woven alumina glass fibers, glass fiber non-woven fabrics, cellulose non-woven fabrics, woven carbon fibers, polymer fabrics, and any combination thereof;

wherein the cured resin product penetrates and is attached to the reinforcing material or is positioned on the surface of the reinforcing material, and wherein the amount of the cured resin product impregnated in the prepreg is from 50 to 70 wt %, based on the total weight of the prepreg.

31. A method of forming a prepreg, comprising:
coating a reinforcing material with the thermosetting composition of claim 1,
drying the coated reinforcing material, and
curing the coated reinforcing material.

32. The method of claim 31, wherein coating comprises applying the thermosetting composition to a surface of the reinforcing material or impregnating the thermosetting composition into the reinforcing material.

33. The method of claim 31, wherein coating is by dip coating or roll coating.

34. The method of claim 31, wherein the coating on the cured coated reinforcing material is a cured resin product, and the amount of the cured resin product is from 50 to 70 wt %, based on the total weight of the prepreg.

* * * * *